United States Patent [19]
Yashita et al.

[11] Patent Number: 5,892,268
[45] Date of Patent: Apr. 6, 1999

[54] INDUCTIVE LOAD DRIVING AND CONTROL CIRCUITS INSIDE ISOLATION REGIONS

[75] Inventors: Takahiro Yashita; Keisuke Kawakita; Hideki Miyake, all of Tokyo, Japan

[73] Assignee: Mitsubishi Denki Kabushiki Kaisha, Tokyo, Japan

[21] Appl. No.: 909,061

[22] Filed: Aug. 14, 1997

[51] Int. Cl.⁶ ................................................ H01L 79/00
[52] U.S. Cl. ..................... 257/544; 257/500; 257/546; 257/547; 257/550; 257/552; 257/553; 327/110
[58] Field of Search .................................... 252/138–140, 252/273, 355, 370, 546, 500, 549, 547, 550, 552, 553, 554, 544; 327/110

[56] References Cited

U.S. PATENT DOCUMENTS

| | | |
|---|---|---|
| 4,905,067 | 2/1990 | Morelli et al. ............................. 357/48 |
| 5,021,860 | 6/1991 | Bertotti et al. ............................ 357/48 |
| 5,119,162 | 6/1992 | Todd et al. ................................ 257/273 |
| 5,204,541 | 4/1993 | Smayling et al. ........................ 257/140 |
| 5,545,917 | 8/1996 | Peppiette et al. ........................ 257/547 |
| 5,753,964 | 5/1998 | Yashita et al. ............................ 257/500 |

FOREIGN PATENT DOCUMENTS

| | | |
|---|---|---|
| 220056 | 1/1990 | Japan . |
| 258350 | 2/1990 | Japan . |
| 364959 | 3/1991 | Japan . |
| 4329665 | 11/1992 | Japan . |

*Primary Examiner*—Fetsum Abraham
*Attorney, Agent, or Firm*—Leydig, Voit & Mayer

[57] ABSTRACT

A semiconductor device includes a power transistor group and a signal circuit on the same substrate. The substrate is grounded at an isolation region at an end of the substrate adjacent to the power transistor group so that the grounded portion of the substrate is distant from the signal circuit.

18 Claims, 18 Drawing Sheets

5,892,268

INDUCTIVE LOAD DRIVING AND CONTROL CIRCUITS INSIDE ISOLATION REGIONS

This disclosure is related to U.S. patent application Ser. No. 08/731,466, filed Oct. 15, 1996, now U.S. Pat. No. 5,753,964.

BACKGROUND OF THE INVENTION

1. Field of the Invention

The present invention relates to a semiconductor device for driving an inductive load, such as a motor.

2. Description of Related Art

FIG. 13 is a diagram showing an example of a motor drive circuit 100. Referring to FIG. 13, Q1, Q2, and Q3 are power transistors connected to a power supply node VM. Q4, Q5, and Q6 are power transistors connected to the ground potential node. A motor 200 is a load. MU, MV, and MW are input terminals of the motor 200. LU, LV, and LW are coils of the respective phases of the motor 200. VM is a power supply node supplied a voltage of the power source for driving the motor 200.

The motor drive circuit 100 shown in FIG. 13 has the power transistors three-phase-connected. The transistors Q1 and Q4 are connected to each other in series, the collector of the transistor Q1 is connected to the power supply node VM, a connection point W between the transistors Q1 and Q4 is, through a terminal 23, connected to the terminal MW of W-phase coil LW of the motor 200 through a terminal 23, and the emitter of the transistor Q4 is connected to the ground potential node through a resistor 17.

The transistors Q2 and Q5 are connected to each other in series. The collector of the transistor Q2 is connected to the power supply node VM. A connection point V between the transistor Q2 and the transistor Q5 is, through a terminal 22, connected to the terminal MV of the V-phase coil LV of the motor 200. The emitter of the transistor Q5 is connected to the ground potential node through the resistor 17.

The transistors Q3 and Q6 are connected to each other in series. The collector of the transistor Q3 is connected to the power supply node VM. A connection point U between the transistors Q3 and Q6 is, through a terminal 21, connected to the terminal MU of the U-phase coil LU of the motor 200. The emitter of the transistor Q6 is connected to the ground potential node through the resistor 17.

In the described structure, a small-signal circuit 40, to be described later, turns the transistors Q3 and Q5 on and the transistors Q1, Q2, Q4, and Q6 off. Thus, a current flows from the coil LU to the coil LV. As a result, a magnetic field is generated by the coils LU and LV in a predetermined direction. A rotor comprising a permanent magnet is rotated in the direction of the generated magnetic field.

FIG. 14 shows a state shifted from the state shown in FIG. 13 with the transistor Q3 turned off and the transistor Q1 turned on. At this time, the current is switched to flow from the coil LW to the coil LV. The current that flows into the coil LU is interrupted. Inductive energy stored in the coil LU makes the voltage at the terminal 21, that is the collector (the connection point U) of the transistor Q6, negative, as shown FIG. 15. FIG. 15 is a graph showing the waveform of the output voltage from the phase U (the terminal 21) of the motor drive circuit.

FIG. 16 is a plan view showing an example of a semiconductor device for driving a motor. Referring to FIG. 16, a chip 100 of the semiconductor device includes a motor drive circuit. Q1 to Q3 are power transistors connected to the power supply node VM. Q4 to Q6 are power transistors connected to the ground potential node. The chip, i.e., semiconductor body, has an end, i.e., side surface, 3 and aluminum wiring layers 5, 6, 8, 9, and 14. Each of the power transistors Q4 to Q6 has a respective area 10 on the semiconductor body. Each of the power transistors Q1 to Q3 has a respective area 11 on the semiconductor body. The epitaxial layer includes an N-type region 12, a resistor 17, and a small-signal circuit 40. A resistor region 30 is located in the small-signal circuit 40. A transistor region 31 is located in the small-signal circuit 40. Although the small-signal circuit 40 includes various circuits, the resistor region 30 and the transistor region 31 are illustrated as examples.

FIG. 17 is a cross-sectional view of the semiconductor device taken along line XVII—XVII of FIG. 16. A P-type semiconductor substrate 1 has on its surface an N-type epitaxial layer. A semiconductor body comprises the semiconductor substrate 1 and the epitaxial layer. An embedded region 2 is located between the semiconductor substrate 1 and the epitaxial layer. P-type isolation regions 25, 26, 27, 28, and 29 extend from the surface of the epitaxial layer to the surface of the semiconductor substrate 1. The isolation regions 25, 26, 27, 28, and 29 surround elements, such as transistors. Aluminum wiring layers 5 to 9 are a first level aluminum layer. A region 10 including the power transistor Q6 in the semiconductor body is surrounded by the isolation regions 25 and 26. The N-type epitaxial layer in the power transistor-forming region 10 is a collector region of the power transistor Q6. A region 11 including the power transistor Q3 is surrounded by the isolation regions 26 and 27. The N-type epitaxial layer of the power transistor-forming region 11 is a collector region of the power transistor Q3. An N-type isolation region 12 is located between the power transistors Q1 to Q6 and the small-signal circuit 40. The isolation region 12 is an N-type island of the epitaxial layer. The structure includes a glass coating 13 and an aluminum wiring layer 14 as a second level aluminum layer. An interlayer insulation layer 16 includes a through hole 15. A contact hole 17 extends through an insulation layer 18. QS is a parasitic transistor. Rcs1 to Rcs3 and Rcs are parasitic resistors. Ic1 to Ic3 and Ics are parasitic currents.

Referring to FIG. 16 and FIG. 17, the collector region of each of the power transistors Q1 to Q3 is connected to the aluminum wiring layer 8 through the through hole 15 of the insulation layer 18. The aluminum wiring layer 8 is connected to the power supply node VM. The base regions of each of the power transistors Q1 to Q6 are P-type regions on the respective collector regions. The base regions of each of the power transistors Q1 to Q6 are connected to respective aluminum wiring layers through the through hole 15 in the insulation layer 18. The aluminum wiring layer corresponding to the base regions of each of the power transistors Q1 to Q6 is connected to control signal supply circuits 45 to 50, to be described later, of the small-signal circuit. To simplify the illustration, details are omitted.

The emitter region of each of the power transistors Q1 to Q6 is an N-type region on the respective base region. The emitter regions of each of the power transistors Q4 to Q6 are connected to the aluminum wiring layer 6 through the through hole 15 of the insulation layer 18. The aluminum wiring layer 6 is connected to the ground potential node through the resistor 17. The emitter regions of each of the power transistors Q1 to Q3 and the collectors of each of the power transistors Q4 to Q6, respectively, are electrically connected to the aluminum wiring layer 14. The aluminum wiring layer 14 is connected to the corresponding terminals 21 to 23 through lead wires.

The isolation region 12 is connected to the aluminum wiring layer 9 through the through hole 15 of the insulation layer 18. The aluminum wiring layer 9 is connected to the power supply node Vcc.

The resistor region 30 in the small-signal circuit 40 is located in the epitaxial layer surrounding the isolation regions 28 and 29. A resistor is a P-type region in the resistor region 30. The P-type region for the resistor is connected to the aluminum wiring layer through the through hole 15 in the insulation layer 18. The transistor region 31 in the small-signal circuit 40 is located in the epitaxial layer surrounding the isolation region 29. The collector region of a transistor is an N-type epitaxial layer of the transistor region 31. The base region of a transistor is the P-type region on the collector region of the transistor. The emitter region of the transistor is the N-type region on the base region of the transistor. The collector, base, and emitter regions are connected to the respective aluminum wiring layers through the through hole 15 of the insulation layer 18. To simplify the illustration, a detailed description of the devices is omitted here.

Referring to FIGS. 13 to 17, the operation of the parasitic transistor QS will now be described. An assumption is made that the potential of the terminal 21 is voltage V when the power transistors Q3 and Q5 of the motor drive circuit 100 have been turned on and a current is flowing from the coil LU to the coil LV of the motor 200. If the current is switched to the direction from the coil LW to the coil LV as a result of control by the motor drive circuit 100, the flow of current in the coil LU is abruptly interrupted. Therefore, inductive energy stored in the coil LU is discharged through a parasitic diode formed between the epitaxial layer of the transistor Q6, which is the collector region, and the semiconductor substrate 1. When the state of activation is shifted from the transistor Q3 to the transistor Q1 and the direction of the current that flows in the coil is shifted as described above, the potential of the collector electrode of the transistor Q6 is transitionally changed to a negative voltage from a positive voltage, as shown in FIG. 15.

Therefore, the potential of the emitter region of the NPN parasitic transistor QS is lower than the potential of the base region of the NPN parasitic transistor QS. The NPN parasitic transistor QS is formed by the collector region of the power transistor Q6, the isolation regions 25 and 26 surrounding the transistor-forming region 10 for the power transistor Q6, and the adjacent epitaxial layer surrounded by the isolation region, such as the collector region of the transistor Q3, and the isolation region 12. The epitaxial layer is the resistor region 30 in the small-signal circuit 40, and the collector region of the transistor in the small-signal circuit 40, etc., as shown in FIG. 17. The isolation region 26 is electrically connected to the ground potential node at its surface.

Thus, the NPN parasitic transistor QS is turned on. The parasitic NPN transistor QS introduces collector current Ic from the adjacent epitaxial layer surrounded by the isolation region. The level of the collector current Ic is raised in the epitaxial layers adjacent to the collector region of the power transistor Q6 in inverse proportion to the distance to the collector region of the power transistor Q6.

In FIG. 17, the collector current Ic1 is introduced from the collector region of the power transistor Q3, the collector current Ic2 is introduced from the isolation region 12, the collector current Ic3 is introduced from the epitaxial layer of the resistor region 30 in the small-signal circuit 40, and the collector current Ics is introduced from the epitaxial layer of the transistor region 31 in the small-signal circuit 40. The total of these collector currents is Ic; that is, the collector currents satisfy the relationship Ic=Ic1+Ic2+Ic3+. . . +Ics. Note that the resistors Rcs1 to Rcs3 and Rcs, as shown in FIG. 17, are series-connected resistor components of the parasitic NPN transistor QS formed by the epitaxial layer, including the collector of the parasitic NPN transistor QS. The series resistor component Rc of the collector (the total of the series resistor components of the parasitic NPN transistor) increases in proportion to the distance from the transistor-forming region 10 for the power transistor Q6. The epitaxial layer of the transistor region 31 in the small-signal circuit 40, which is affected most considerably when the parasitic NPN transistor QS has introduced the collector current, is distant from the power transistor. Therefore, Rc is enlarged, reducing Ics.

FIG. 18 is a diagram showing a pattern of the small-signal circuit 40 on a semiconductor body including a 120° -matrix circuit 41, a control amplifier circuit (CTL AMP) 42, a triple differential amplifier circuit 43, a sub-circuit TSD (terminal shut down) 44, and control signal generating circuits 45 to 48. The type and configuration of the devices may, of course, be varied arbitrarily to adapt a motor that must be controlled. The small-signal circuit 40 receives a signal $Hu^+$, $Hu^-$, $Hv^+$, $Hv^-$, $Hw^+$, $Hw^-$, generated by a Hall device located in the motor 200 and indicating the position of the rotor of the motor 200, to control the period during which the power transistors Q1 to Q6 in the motor drive circuit 100 are supplied with power corresponding to the detected position of the rotor.

The structure will now be described somewhat further in detail. The positional relationship among the phases as the time elapses is calculated in response to position signals $Hu^+$, $Hu^-$, $Hv^+$, $Hv^-$, $Hw^+$, and $Hw^-$ generated by the Hall devices for the phases U, V, and W. The base electrodes of the power transistors Q1 to Q6 in the motor drive circuit 100 are controlled through the triple differential amplifier circuit 43 and the control signal generating circuits 45 to 50. The control amplifier circuit 42 is a section for controlling the triple differential amplifier circuit 43 in response to a control signal generated by a control unit, such as a computer. A portion 44 includes a variety of sub-units, for example, a TSD circuit, a constant voltage source, a power supply circuit, and the like.

As described above, the parasitic transistor QS may be turned on and affect the other circuits if the potential of the emitter region of the NPN transistor becomes lower than the ground potential. For example, the epitaxial layer of the transistor region 31 in the small-signal circuit 40 having a multiplicity of high-impedance devices raises a critical problem, contributing to malfunctioning in the control of the motor drive circuit 100. The circuit malfunctions if a current is extracted.

Accordingly, the conventional semiconductor device has an NPN transistor having a collector region connected to the power supply node and the N-type isolation region 12 is disposed between the small-signal circuit 40 and the motor drive circuit 100, so the potential of region 12 can be made lower than the ground potential.

Moreover, the inside portion of the small-signal circuit 40 has a device (such as a resistor, refer to the epitaxial layer of the resistor region 30 shown in FIG. 17) so that the N-type isolation region 12 is connected to the power supply node Vcc and disposed between the small-signal circuit 40 and the motor drive circuit 100. As described above, in this structure, the collector current Ic, required by the parasitic transistor QS, flows to the emitter region of the power transistors Q4 to Q6 from the N-type isolation region 12 connected to the power supply node Vcc to minimize the collector current Ics flowing from the collector region of the transistor in the small-signal circuit 40.

However, there arise problems. (1) The conventional semiconductor device cannot easily eliminate the influence of the collector current Ic of the parasitic transistor QS due to parasitic circuit elements. To reduce the influence, the area of, for example, the N-type isolation region 12 connected to the power supply node Vcc must be enlarged so the cost of the chip cannot be reduced. (2) A large amount of electrical power is consumed because the collector current Ic of the parasitic transistor QS flows from the power supply node Vcc to relieve the current attributable to the parasitic circuit elements.

SUMMARY OF THE INVENTION

The present invention overcomes the above-mentioned problems.

According to one aspect of the present invention, there is provided a semiconductor device comprising a power transistor group and a signal circuit formed on a semiconductor body and an isolation region located at an end of the semiconductor body, adjacent to the power transistor group, wherein the isolation region is electrically connected to a ground potential node.

Another aspect of the present invention provides a semiconductor device for driving a motor, the device comprising:
a semiconductor body including a P-type semiconductor substrate and an N-type epitaxial layer on the semiconductor substrate, the semiconductor body having a first area and a second area arranged along a first direction;
a power transistor group for driving a motor and located in the first area of the semiconductor body;
a signal circuit for controlling the power transistor group and located in the second area; and
a P-type isolation region extending from the surface of the epitaxial layer to the surface of the semiconductor substrate, surrounding the power transistor group, wherein the P-type isolation region, positioned between the first area of the semiconductor body and the end of the semiconductor body along the first direction, is electrically connected to a ground potential node.

DETAILED DESCRIPTION OF PREFERRED EMBODIMENTS

First Embodiment

Figure 1:
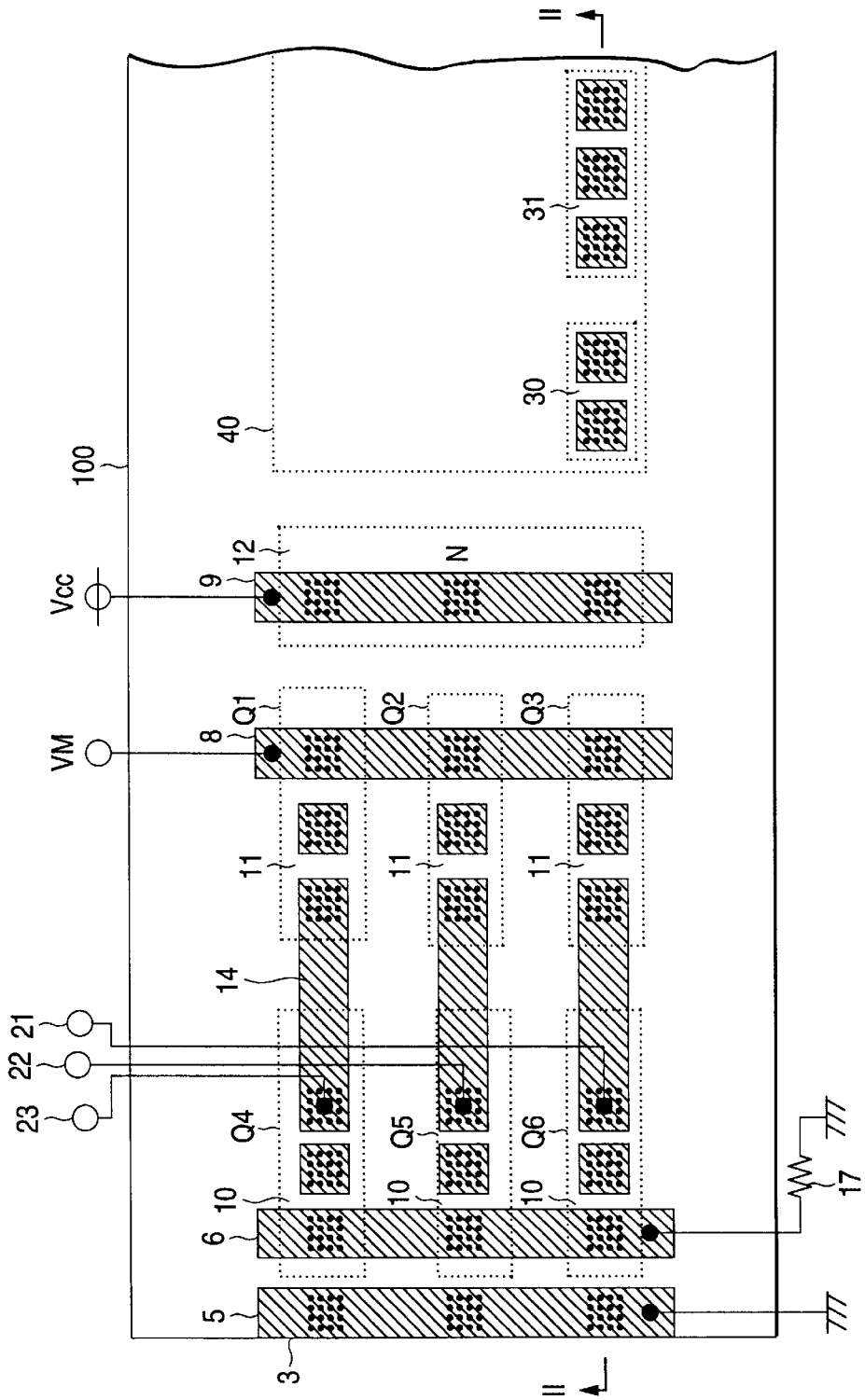
FIG. 1 is a plan view showing a semiconductor device according to a first embodiment of the present invention.

FIG. 1 is a plan view showing a semiconductor device for a motor drive circuit according to a first embodiment of the present invention. Referring to FIG. 1, the device includes a motor drive circuit 100, power transistors Q1 to Q3 connected to a power supply node VM, and power transistors Q4 to Q6 connected to the ground potential node. The semiconductor body, i.e., chip, has an end 3, i.e., side surface, where the chip ends. The chip includes aluminum wiring layers 5, 6, 8, 9, and 14. Each of the power transistors Q4 to Q6 has a respective region 10 on the ground side of the semiconductor body. Each of the power transistors Q1 to Q3 has a respective region 11 on the power supply source side of the semiconductor body. An N-type isolation region 12 (guard region) is formed by an N-type region in an epitaxial layer. The isolation region 12 is disposed between and separates a region including the motor drive circuit 100 from a region including the small-signal circuit 40. 17 is a resistor. A resistor region 30 includes a resistor of the small-signal circuit 40 in the semiconductor body. A transistor region 31 includes a transistor of the small-signal circuit 40 in the semiconductor body. Although the small-signal circuit 40 includes a variety of circuits, the resistor section 30 and the transistor section 31 are illustrated as examples.

Referring to FIG. 1, collector regions, located in the epitaxial layer in the region 11, of the power transistors Q1 to Q3 on the power supply source side are electrically connected to the power supply node VM. Emitter regions, N-type regions in base regions, of the power transistors Q4 to Q6 on the ground side are electrically connected to the ground potential node through the resistor 17. The emitters, N-type regions in the base regions, of the power transistors Q1 to Q3 on the power supply source side and the collectors, the epitaxial layer regions 10, of the power transistors Q4 to Q6 on the ground side, are electrically connected to one another at corresponding phases and are also electrically connected to the corresponding terminals 21 to 23 of the motor drive circuit 100. The aluminum wiring layer 5 is disposed between the end 3 of the semiconductor body and the regions 10 for the power transistors Q4 to Q6 on the ground side. The aluminum wiring layer 5 is electrically connected to the ground potential node. An isolation region surrounding the regions 10 for the power transistors Q4 to Q6 is electrically connected to the aluminum wiring layer 5. The N-type isolation region 12 is electrically connected to the aluminum wiring layer 9. The aluminum wiring layer 9 is electrically connected to the power supply source node Vcc. Since the connection is established as shown in FIG. 16, its description is omitted.

Figure 2:
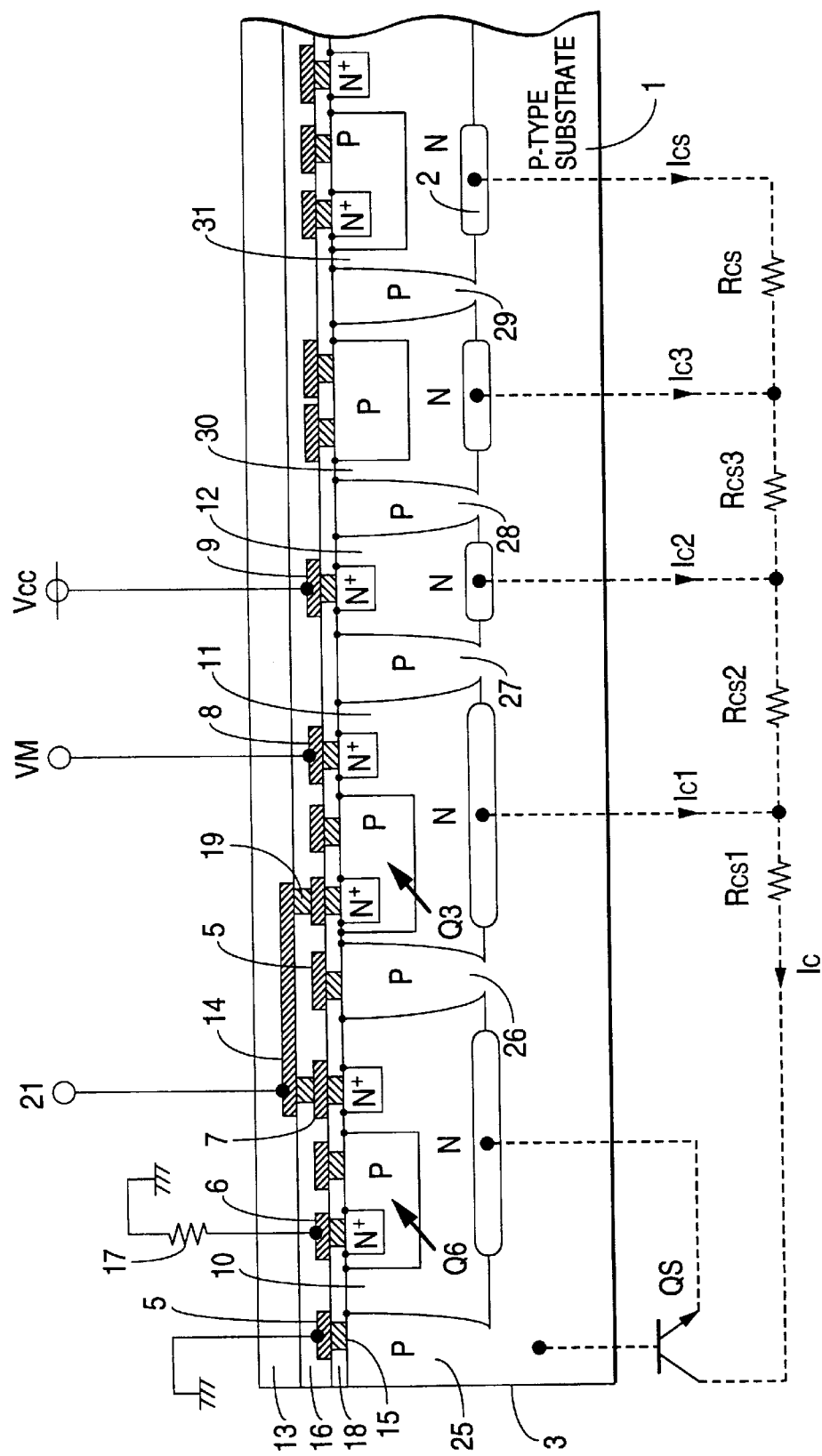
FIG. 2 is a cross-sectional view showing the semiconductor device according to the first embodiment of the present invention.

FIG. 2 is a cross-sectional view of the semiconductor device taken along line II—II of FIG. 1. Referring to FIG. 2, reference numeral 1 represents a P-type semiconductor substrate. An N-type epitaxial layer is located on the surface of the semiconductor substrate 1. A semiconductor body comprises the semiconductor substrate 1 and the epitaxial layer. Embedded regions 2 are located between the semiconductor substrate 1 and the epitaxial layer. P-type isolation regions 25, 26, 27, 28, and 29 extend from the surface of the epitaxial layer to the semiconductor substrate 1. The isolation regions 25, 26, 27, 28, and 29 surround an element, such as a transistor, a resistor, etc. A first level aluminum wiring layer includes parts 5-9. A region 10 includes the power transistor Q6 in the semiconductor body surrounded by the isolation regions 25 and 26. The N-type epitaxial layer of the power transistor in region 10 is a collector region of the power transistor Q6. 11 represents a region of the power transistor Q3 in the semiconductor body surrounded by the isolation regions 26 and 27. The N-type epitaxial layer of the power transistor region 11 is a collector region of the power transistor Q3. An N-type isolation region 12 is disposed between the motor drive circuit 100 and the small-signal circuit 40. The isolation region 12 is an N-type region of the epitaxial layer. A glass coating 13 protects the structure including a second level aluminum wiring layer 14. A through hole 15 extends through an insulating layer 18 on which an interlayer insulating layer 16 is disposed and which includes a contact hole 19. QS is a parasitic transistor. Rc1 to Rcs3 and Rcs are parasitic resistors. Ic1 to Ic3 and Ics are parasitic currents. The isolation region 25, which is a part of an isolation region surrounding the regions 10 for the power transistors Q4 to Q6, disposed between the end 3 of the semiconductor body and the regions 10, is electrically connected to the aluminum wiring layer 5 through the through hole 15 of the insulation layer 18. The aluminum wiring layer 5 is electrically connected to the ground potential node.

Referring to FIGS. 1 and 2, a resistor region 30 includes a resistor in the small-signal circuit 40 of the semiconductor body. A transistor region 31 is located in the small-signal circuit 40 of the semiconductor body. Although the small-signal circuit 40 includes a variety of circuits, the resistor region 30 and the transistor region 31 are illustrated as examples.

Figure 16:
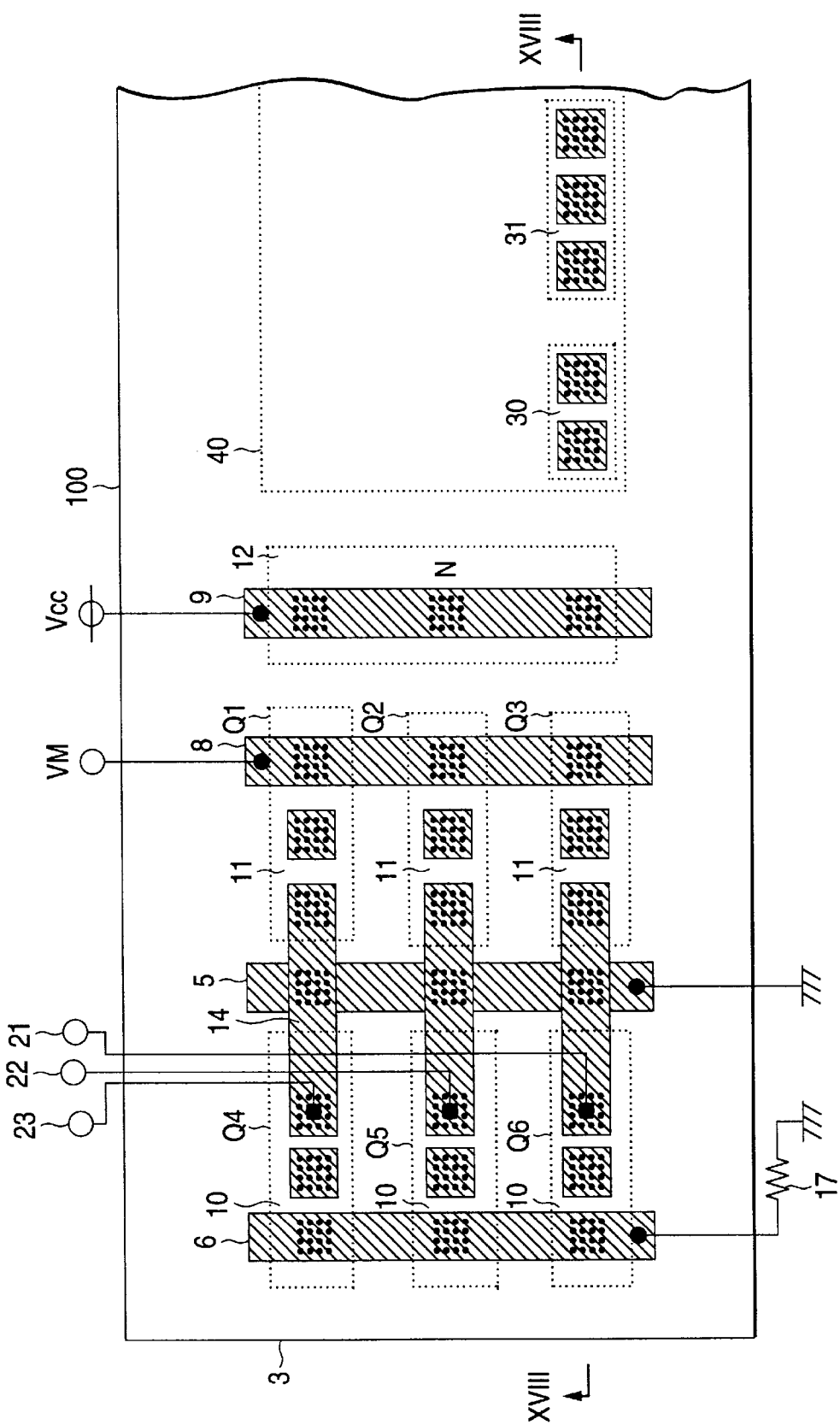
FIG. 16 is a plan view showing an example of a semiconductor device for driving a motor.
Figure 17:
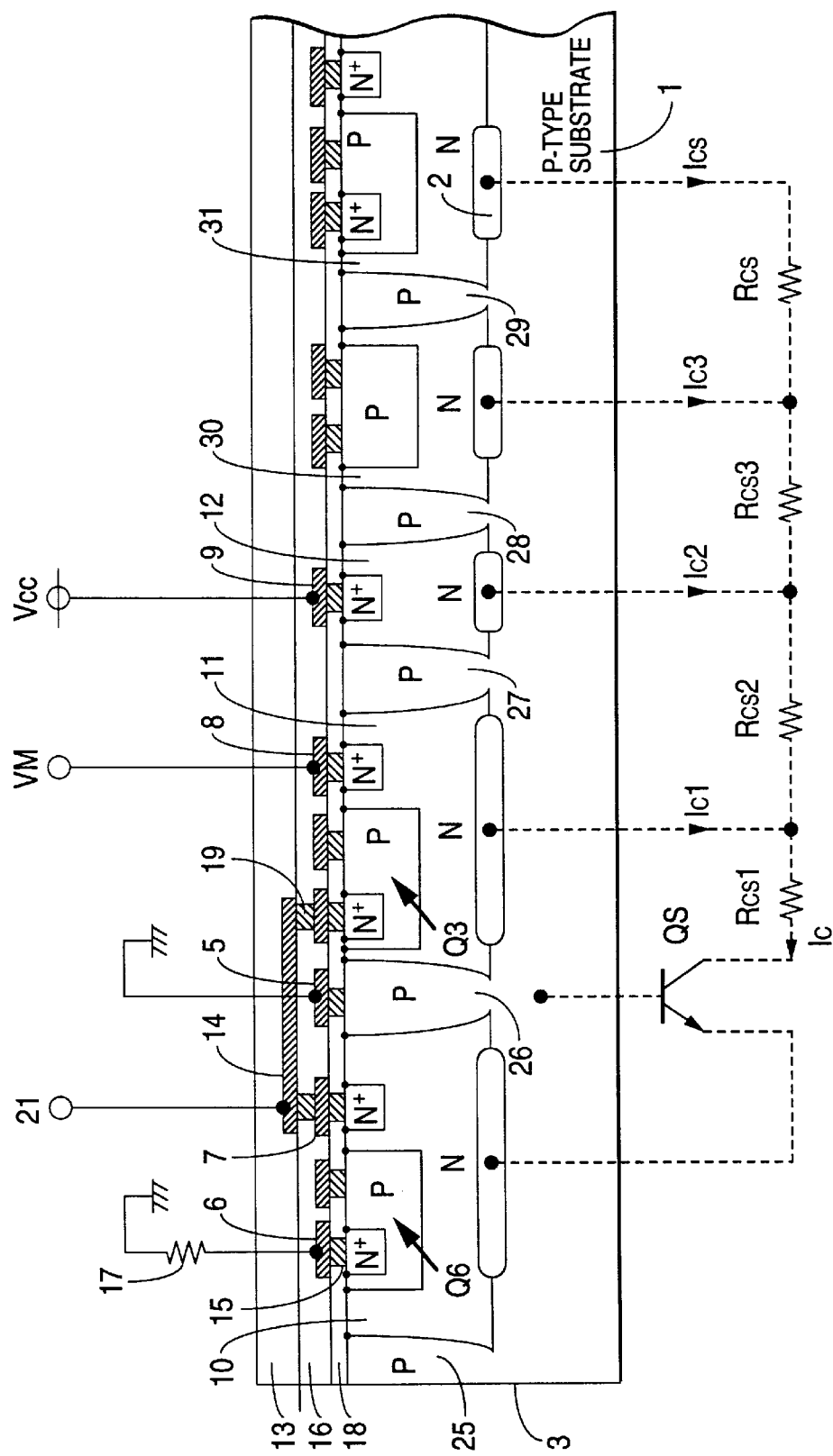
FIG. 17 is a cross-sectional view of the semiconductor device of FIG. 16 taken along line XVII—XVII of FIG. 16.
Figure 18:
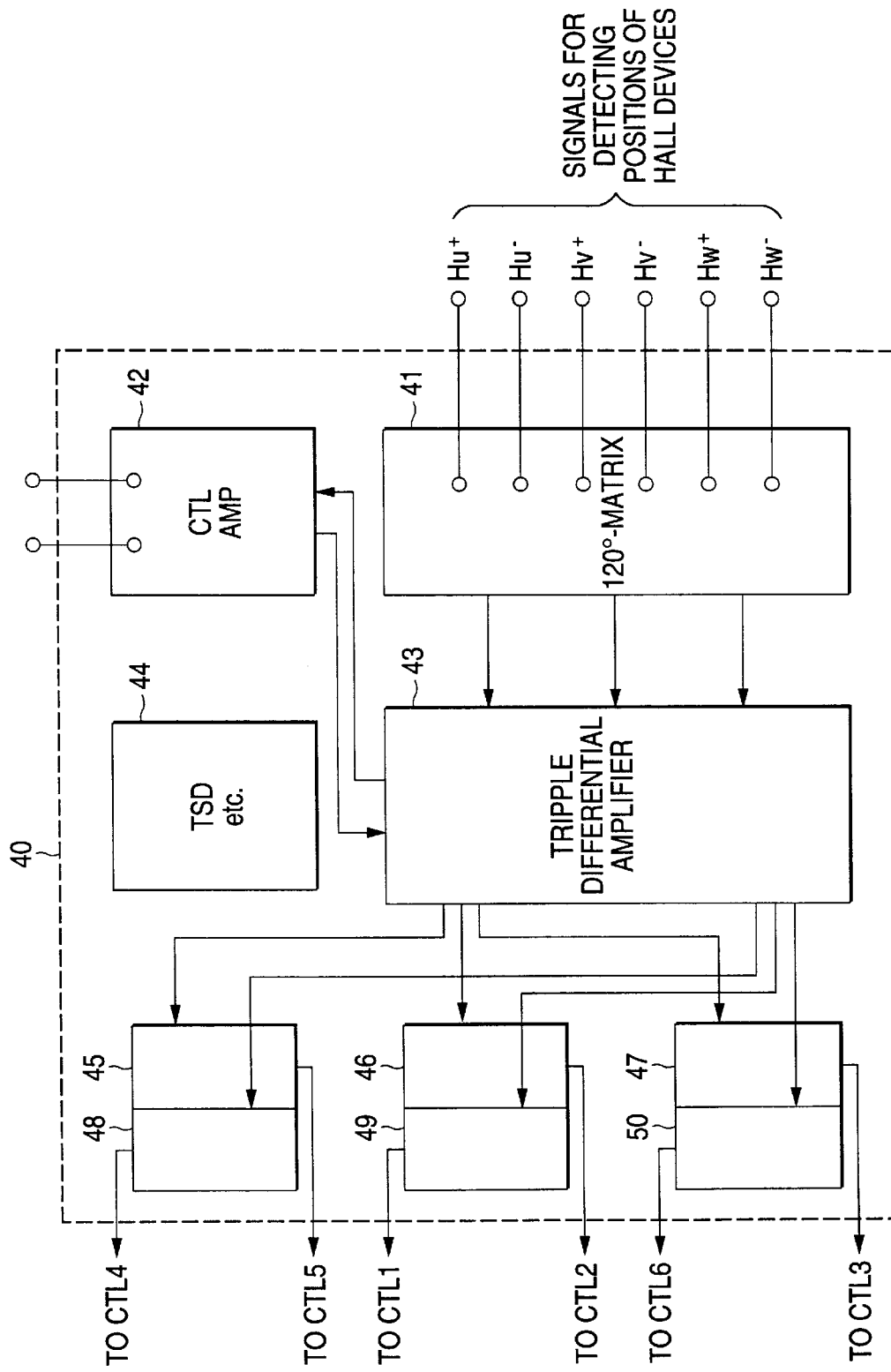
FIG. 18 is a diagram showing a pattern of the small-signal circuit on a semiconductor substrate.

The structure shown in FIGS. 1 and 2 is different from the structure shown in FIGS. 16 and 17 in that the ground point of the semiconductor substrate 1 is located at the end 3 of the semiconductor body, distant from the small-signal circuit 40, and the semiconductor substrate 1 is not directly grounded in the area between each of the power transistors Q1 to Q3 and the small-signal circuit 40. As a result of the grounding structure, in the parasitic transistor QS, the grounded portion of the isolation region 25 is a base region, the collector regions of the transistors Q4 to Q6 become emitter regions, and the collector regions of the transistors Q1 to Q3, the N-type isolation region 12, and the epitaxial layers of the resistor region 30 and the transistor region 31 in the small-signal circuit 40, etc., serve as a collector region.

Figure 15:
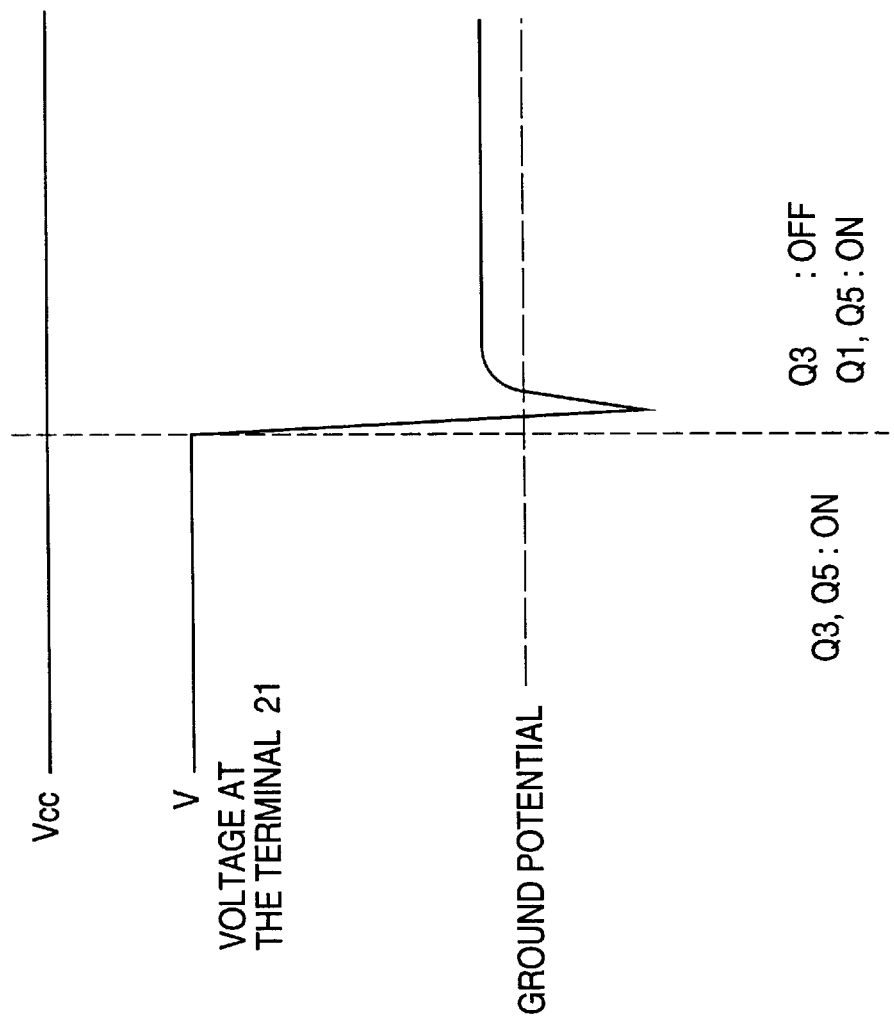
FIG. 15 is a graph showing the waveform of voltage output from the motor drive circuit.

An assumption is made that the potential of the terminal 21 is voltage V when the power transistors Q3 and Q5 of the motor drive circuit 100 are turned on and a current is flowing from the coil LU to the coil LV of the motor 200. If the current is switched to flow in the direction from the coil LW to the coil LV by the motor drive circuit 100, flow of the current in the coil LU is abruptly interrupted. Therefore, inductive energy stored in the coil LU is discharged through a parasitic diode between the epitaxial layer of the power transistor Q6, the collector region, and the semiconductor substrate 1. When a state of activation has been shifted from the transistor Q3 to the transistor Q1 and the direction in which the current flows in the coil has been switched, the potential of the collector electrode of the transistor Q6 is transitionally switched to a negative voltage from a positive voltage, as shown in FIG. 15.

At this time, the potential of the emitter region of the NPN parasitic transistor QS becomes lower than the potential of the base region of the NPN parasitic transistor QS, electrically connected to the ground potential node. The NPN parasitic transistor QS is formed by the collector region of the power transistor Q6, the isolation regions 25 and 26 surrounding the transistor region 10 of the power transistor Q6, and the adjacent epitaxial layer surrounded by the isolation region, such as the collector region of the transistor Q3, the isolation region 12, the epitaxial layer including the resistor region 30 in the small-signal circuit 40, and the collector region of the transistor in the small-signal circuit 40, etc., as shown in FIG. 2. The isolation region 25 is electrically connected to the ground potential node at the surface of the region 25.

As a result, the NPN parasitic transistor QS is turned on. In the structure according to the first embodiment in which the P-type substrate 1 is grounded at the end 3 of the semiconductor body, the resistance Rcs of the collector series resistor components of the NPN parasitic transistor QS is raised and the parasitic collector current Ics flow in the small-signal circuit 40 is prevented. Thus, abnormal operation in the small-signal circuit 40 is prevented.

Since a large current is introduced from the collector region of the power transistor Q1 on the power supply source side, which is connected to the power supply source node VM, to the collector region of the power transistor Q6 on the ground side by the NPN parasitic transistor QS, the current from the N-type isolation region 12 to the collector region of the power transistor Q6 is lowered. Therefore, the area of the N-type isolation region 12 can be reduced as compared with the N-type isolation region 12 of the device described above. The area of the semiconductor body can be reduced by the reduced area of the N-type isolation region 12.

Second Embodiment

Figure 3:
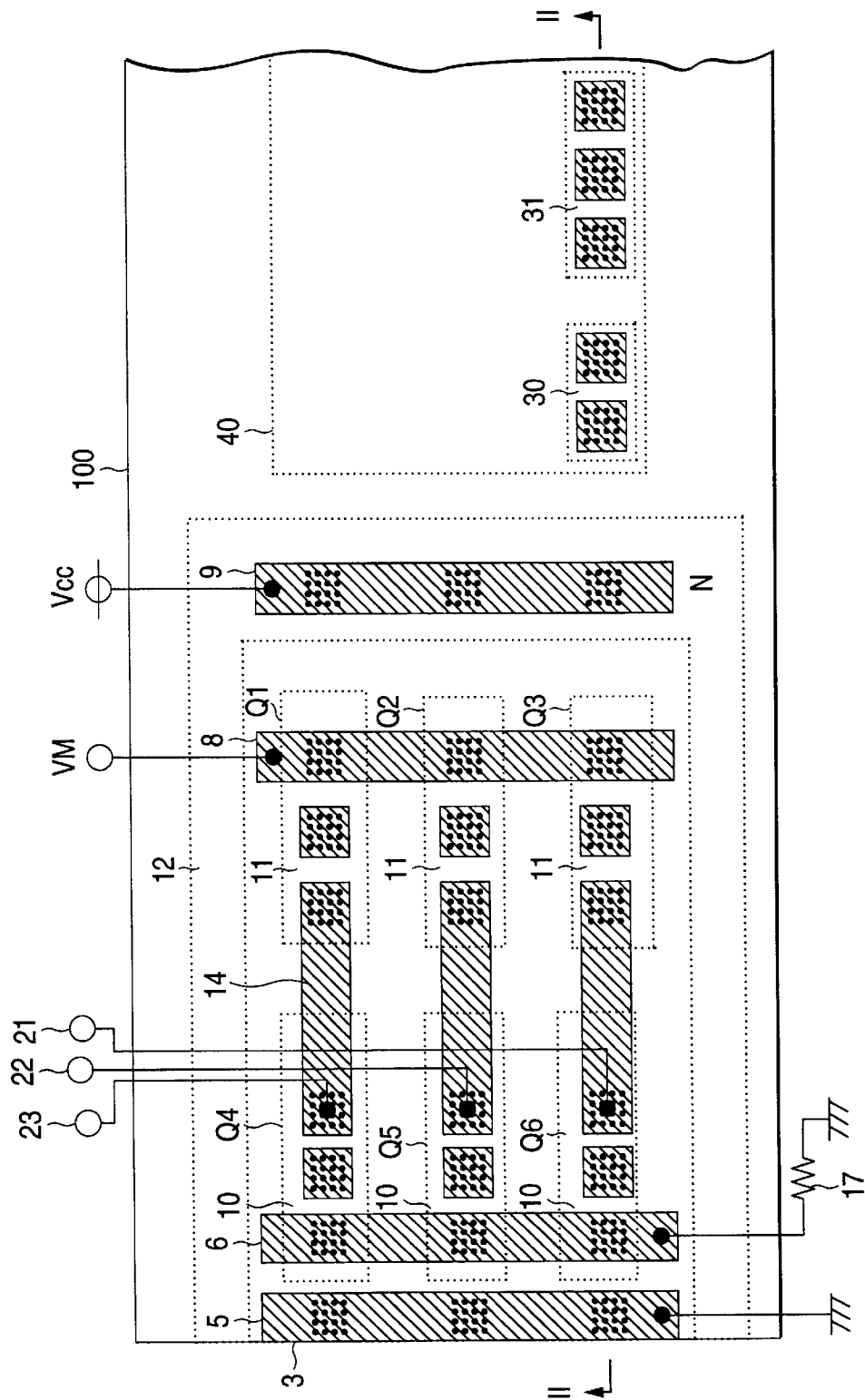
FIG. 3 is a plan view showing a semiconductor device according to a second embodiment of the present invention.

FIG. 3 is a plan view showing a semiconductor device for a motor drive circuit according to a second embodiment of the present invention. Referring to FIG. 3, the same reference numerals as those in FIG. 1 represent the same elements, and a detailed description of those elements is omitted. The structure of FIG. 3 is different from FIG. 1 in that the N-type isolation region 12 surrounds the regions 10 including the power transistors Q4 to Q6 on the ground side and the regions 11 including the power transistors Q1 to Q3 on the power supply source side. A cross-sectional view of the semiconductor device taken along line II—II of FIG. 3 is same as FIG. 2.

Referring to FIG. 3, the collector regions, which are in the epitaxial layer regions 11, of the power transistors Q1 to Q3 on the power supply source side are electrically connected to the power supply node VM. The emitter regions, N-type regions in the base regions, of the power transistors Q4 to Q6 on the ground side are electrically connected to the ground potential node through the resistor 17. The emitter regions, N-type regions in the base regions, of the power transistors Q1 to Q3 on the power supply source side, and the collector regions, the epitaxial layer regions 10, of the power transistors Q4 to Q6 on the ground side, are electrically connected to one another at corresponding phases and also electrically connected to the corresponding terminals 21 to 23 of the motor drive circuit 100.

In the second embodiment, the N-type isolation region 12 surrounds the regions 10 of the power transistors Q4 to Q6 on the ground side and the regions 11 of the power transistors Q1 to Q3 on the power supply source side in a "U" shaped pattern. The surrounding structure enables larger currents to be introduced into the collector regions of the power transistors Q4 to Q6 on the ground side from the N-type isolation region 12 by the NPN parasitic transistor QS. Therefore, the collector series resistance Rcs of the NPN parasitic transistor QS is raised so the parasitic collector current Ics that flows in the small-signal circuit 40 is reduced. As a result, abnormal operation in the small-signal circuit 40 is prevented.

Third Embodiment

Figure 4:
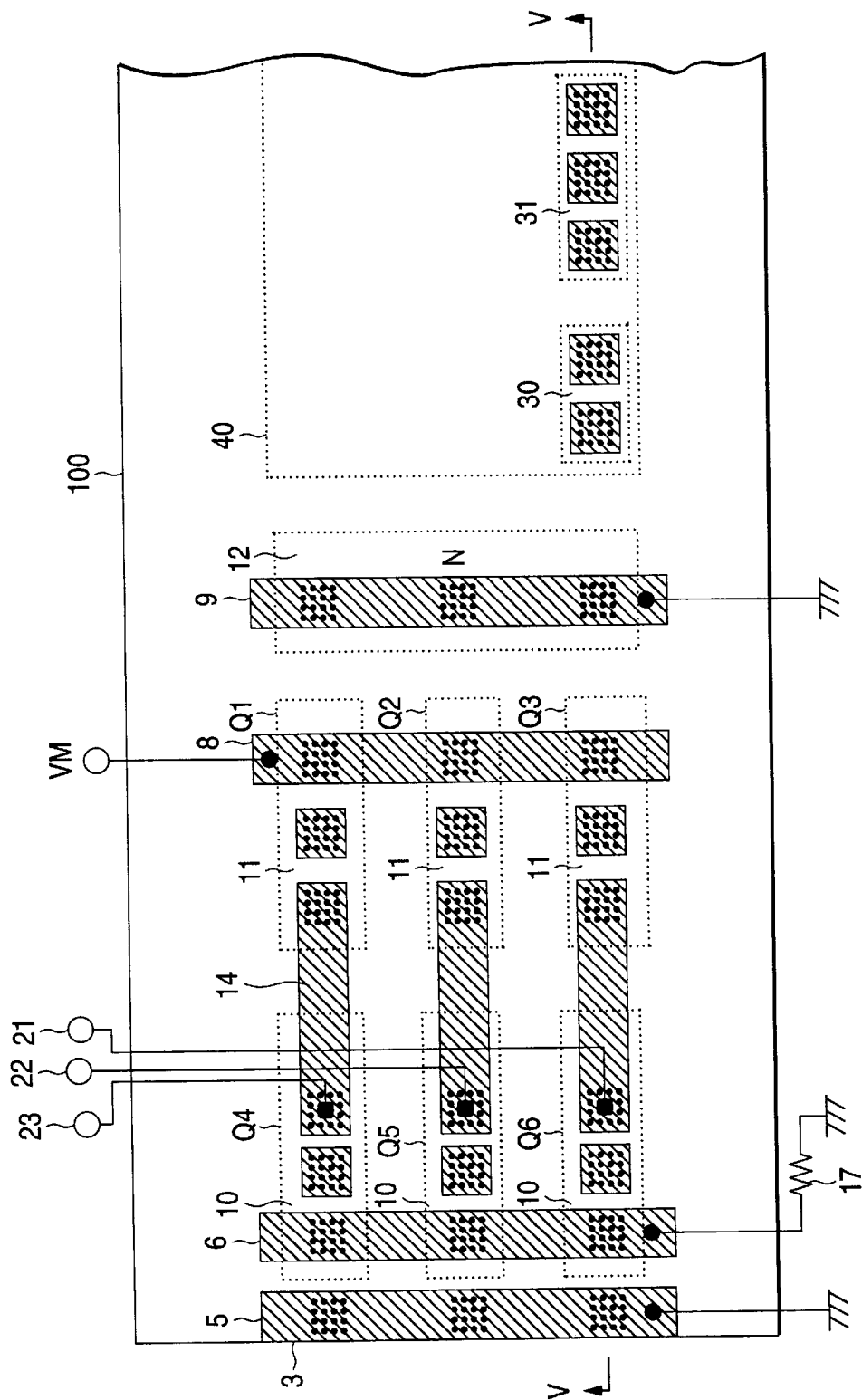
FIG. 4 is a plan view showing a semiconductor device according to a third embodiment of the present invention.
Figure 5:
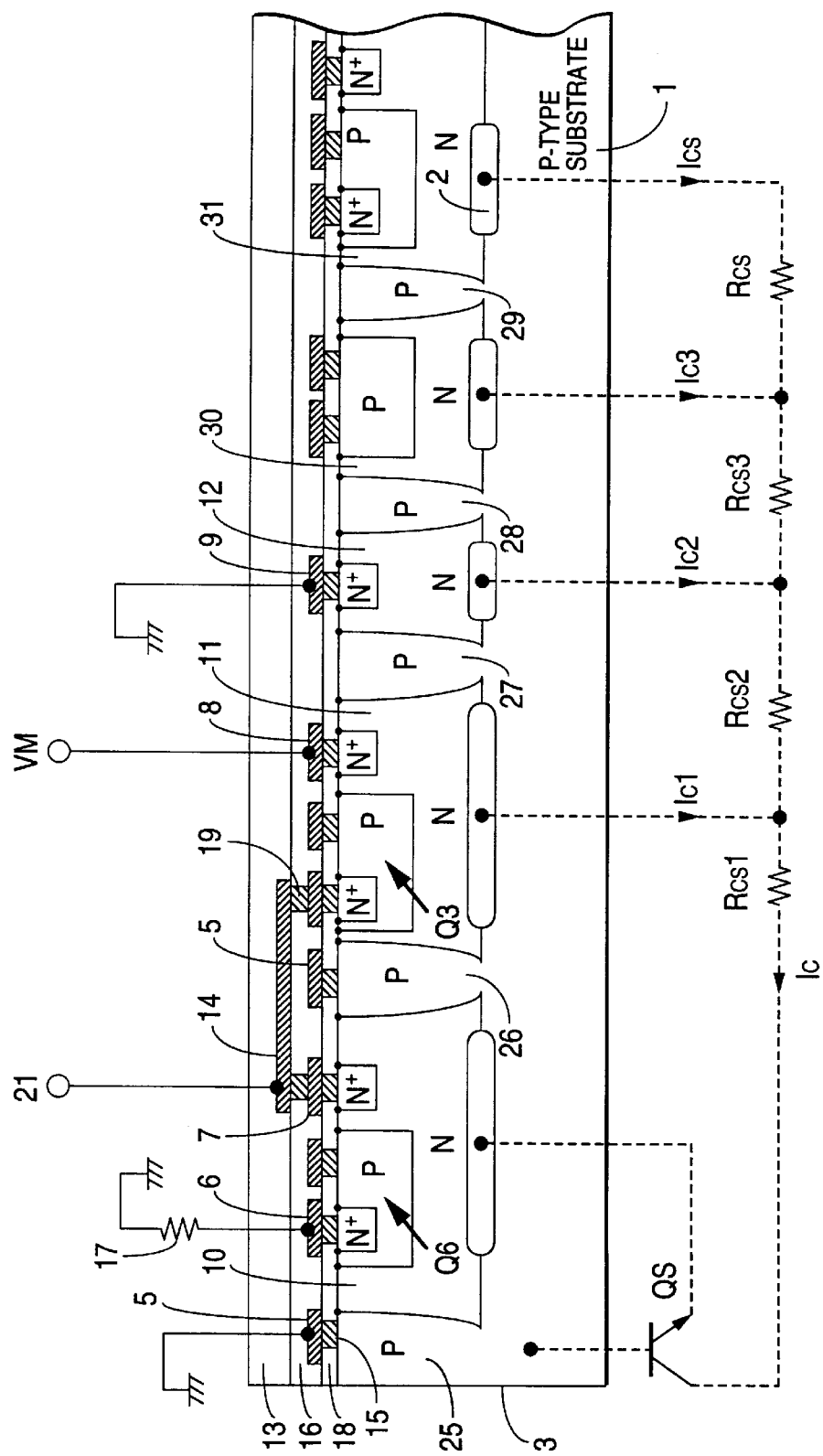
FIG. 5 is a cross-sectional view showing the semiconductor device according to the third embodiment of the present invention.

FIG. 4 is a plan view showing a semiconductor device for a motor drive circuit according to a third embodiment of the present invention. FIG. 5 is a cross-sectional view of the semiconductor device taken along line V—V of FIG. 4. Referring to FIGS. 4 and 5, the same reference numerals as those shown in FIGS. 1 and 2 represent the same elements and, therefore, description of those elements is omitted.

Referring to FIG. 4, the collector regions, the epitaxial layer regions 11, of the power transistors Q1 to Q3 on the power supply source side are electrically connected to the power supply node VM. The emitter regions, N-type regions in the base regions, of the power transistors Q4 to Q6 on the ground side are electrically connected to the ground potential node through the resistor 17. The emitter regions, N-type regions in the base regions, of the power transistors Q1 to Q3 on the power supply source side, and the collector regions, in the epitaxial layer regions 10, of the power transistors Q4 to Q6 on the ground side, are electrically connected to one another at corresponding phases and are also electrically connected to the corresponding terminals 21 to 23 of the motor drive circuit 100.

The isolation region 25, a part of an isolation region surrounding the regions 10 for the power transistors Q4 to Q6, disposed between the end 3 of the semiconductor body and the regions 10, is electrically connected to the aluminum wiring layer 5 through the through hole 15 in the insulation layer 18. The aluminum wiring layer 5 is electrically connected to the ground potential node. The N-type isolation region 12 is disposed between the motor drive circuit 100 and the small-signal circuit 40. The N-type isolation region 12 is electrically connected to the aluminum wiring layer 9 through the through hole 15 in the insulation layer 18. The aluminum wiring layer 9 is electrically connected to the ground potential node.

The structure shown in FIGS. 4 and 5 is different from that shown in FIGS. 1 and 2 in that the N-type isolation region 12 is electrically connected to the ground potential node through the through hole 15 of the insulation layer 18 and the aluminum wiring layer 9. The structure will now be described in detail.

As a result of the grounding structure, the parasitic transistor QS is brought into a state in which the grounded portion of the isolation region 25 is a base region, the collector regions of the transistors Q4 to Q6 are an emitter region of the parasitic transistor, and the collector regions of the transistors Q1 to Q3, the N-type isolation region 12, and the epitaxial layers of the resistor region 30 and the transistor region 31 in the small-signal circuit 40, etc., serve as a collector region of the parasitic transistor.

An assumption is made that the potential of the terminal 21 is voltage V when the power transistors Q3 and Q5 of the motor drive circuit 100 have been turned on and a current is flowing from the coil LU to the coil LV of the motor 200. If the current is switched to the direction from the coil LW to the coil LV by the motor drive circuit 100, the flow of current in the coil LU is abruptly interrupted. Therefore, inductive energy stored in the coil LU is discharged through a parasitic diode between the epitaxial layer of the power transistor Q6, the collector region, and the semiconductor substrate 1. When a state of activation has been shifted from the transistor Q3 to the transistor Q1 and the direction of the current flow in the coil has been switched, the potential of the collector electrode of the transistor Q6 is transitionally made negative from a positive voltage, as shown in FIG. 15.

The potential of the emitter region of the NPN parasitic transistor QS is lower than the potential of the base region of the NPN parasitic transistor QS electrically connected to the ground potential node. The NPN parasitic transistor QS is turned on. In the structure according to the third embodiment in which the P-type substrate 1 is grounded at the end 3 of the semiconductor body, the resistance Rcs of the collector series resistor components of the NPN parasitic transistor QS is raised. Thus, the parasitic collector current Ics which flows in the small-signal circuit 40 is prevented and abnormal operation in the small-signal circuit 40 is prevented.

Since a large current is introduced from the collector region of the power transistor Q1 on the power supply source side, which is connected to the power supply source node VM, to the collector region of the power transistor Q6 on the ground side by the NPN parasitic transistor QS, the current flow from the N-type isolation region 12 to the collector region of the power transistor Q6 is lowered. Therefore, the area of the N-type isolation region 12 can be reduced, as compared with the N-type isolation region 12 of the device described above, by the reduced area of the N-type isolation region 12.

The third embodiment has a structure in which the aluminum wiring layer 9 is electrically connected to the ground node to reduce the difference in the potential between the aluminum wiring layer 9 and the emitter region of the parasitic transistor QS, which is the collector region of the power transistors Q4 to Q6 on the ground side, to about 1 V. As a result, an advantage can be realized in that power consumption due to the collector current Ic2 which flows in the N-type isolation region 12 is reduced.

Fourth Embodiment

Figure 6:
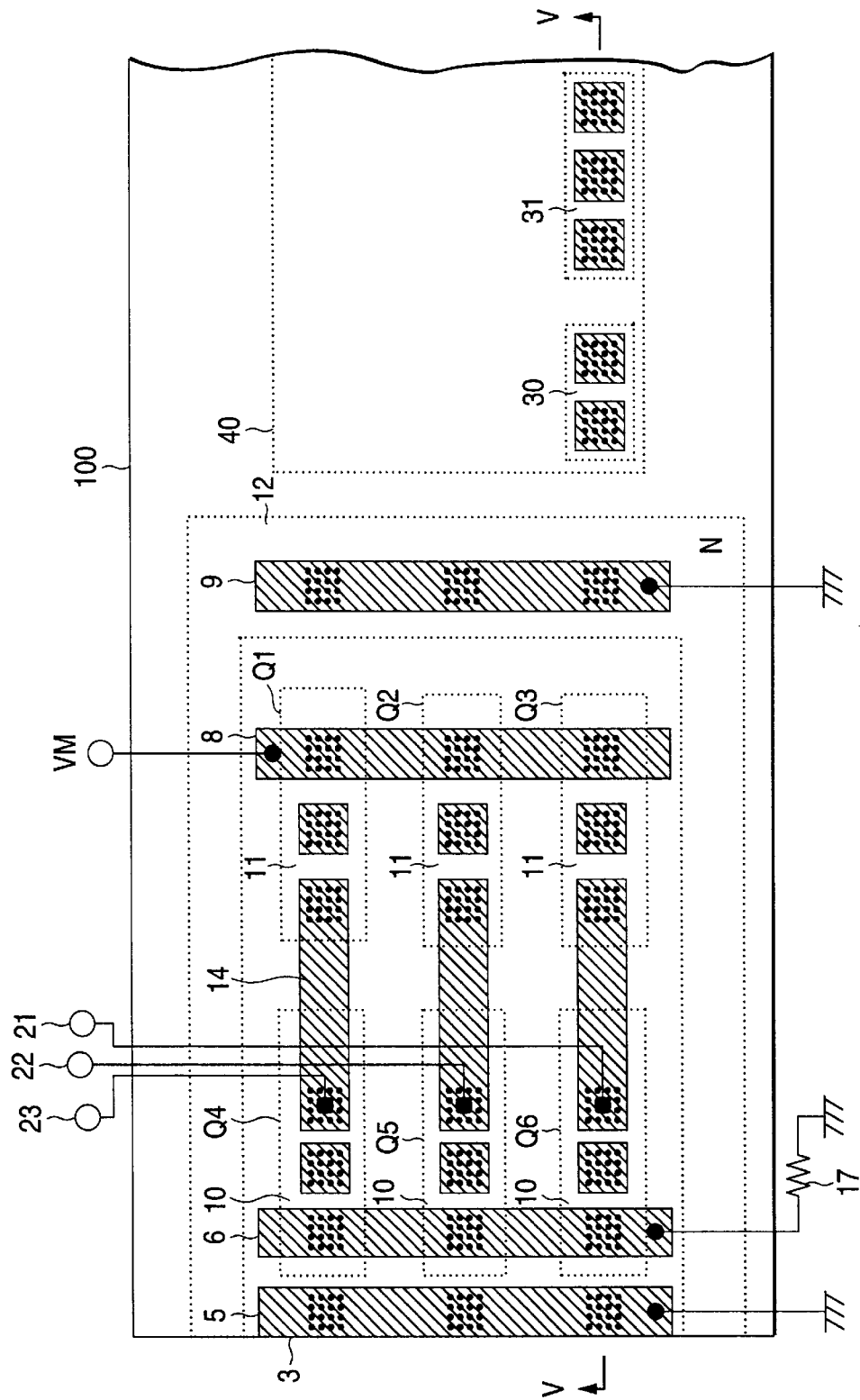
FIG. 6 is a plan view showing a semiconductor device according to a fourth embodiment of the present invention.

FIG. 6 is a plan view showing a semiconductor device for a motor drive circuit according to a fourth embodiment of the present invention. A cross-sectional view showing the semiconductor device, taken along line V—V of FIG. 6, is the same as FIG. 5. Referring to FIG. 6, the same reference numerals represent the same elements as those shown in FIGS. 1 to 5, so description of those elements is omitted. The structure shown in FIG. 6 is different from that shown in FIG. 4 in that the N-type isolation region 12 surrounds the regions 10 of the power transistors Q4 to Q6 on the ground side and the regions 11 of the power transistors Q1 to Q3 on the power supply source side.

Referring to FIG. 6, the collector regions, the epitaxial layer regions 11, of the power transistors Q1 to Q3 on the power supply source side are electrically connected to the power supply node VM. The emitter regions, N-type regions in the base regions, of the power transistors Q4 to Q6 on the ground side are electrically connected to the ground potential node through the resistor 17. The emitter regions, N-type regions in the base regions, of the power transistors Q1 to Q3 on the power supply source side, and the collector regions, the epitaxial layer regions 10, of the power transistors Q4 to Q6 on the ground side, are electrically connected to one another at corresponding phases and are also electrically connected to the corresponding terminals 21 to 23 of the motor drive circuit 100.

The isolation region 25, which is a part of an isolation region surrounding the regions 10 for the power transistors Q4 to Q6, disposed between the end 3 of the semiconductor body and the regions 10, is electrically connected to the aluminum wiring layer 5 through the through hole 15 of the insulation layer 18.

The aluminum wiring layer 5 is electrically connected to the ground potential node. The N-type isolation region 12 is disposed between the motor drive circuit 100 and the small-signal circuit 40. The N-type isolation region 12 is electrically connected to the aluminum wiring layer 9 through the through hole 15 in the insulation layer 18. The aluminum wiring layer 9 is electrically connected to the ground potential node.

The fourth embodiment has the same structure as the third embodiment except for the N-type isolation region 12 surrounding the region 10 of the power transistors Q4 to Q6 on the ground side and the region 11 of the power transistors Q1 to Q3 on the power supply source side in a "U" shaped pattern. As a result of the surrounding structure, large currents can be introduced into the collector regions of the power transistors Q4 to Q6 on the ground side from the N-type isolation region 12 by the NPN parasitic transistor QS. Therefore, the collector series resistance Rcs of the NPN parasitic transistor QS is increased so the parasitic collector current Ics which flows in the small-signal circuit 40 is reduced. Thus, any abnormal operation in the small-signal circuit 40 is prevented.

Since a large current is mainly introduced into the collector regions of the power transistors Q4 to Q6 on the ground side from the collector regions of the power transistors Q1 to Q3 on the power supply source side by the NPN parasitic transistor QS, the collector current flow from the N-type isolation region 12 to the collector region of the power transistors Q4 to Q6 by the NPN parasitic transistor QS is reduced. As a result, the area of the N-type isolation region 12 can be reduced. Therefore, the area of the semiconductor body can be reduced by the reduction in the area of the N-type isolation region 12.

The fourth embodiment having a structure in which the aluminum wiring layer 9 is electrically connected to the ground node reduces the difference in the potential between the aluminum wiring layer 9 and the emitter region of the parasitic transistor QS, which are the collector regions of the power transistors Q4 to Q6 on the ground side, to about 1 V. As a result, an advantage can be realized in that power consumption due to the collector current Ic2 which flows in the N-type isolation region 12 is reduced.

Fifth Embodiment

Figure 7:
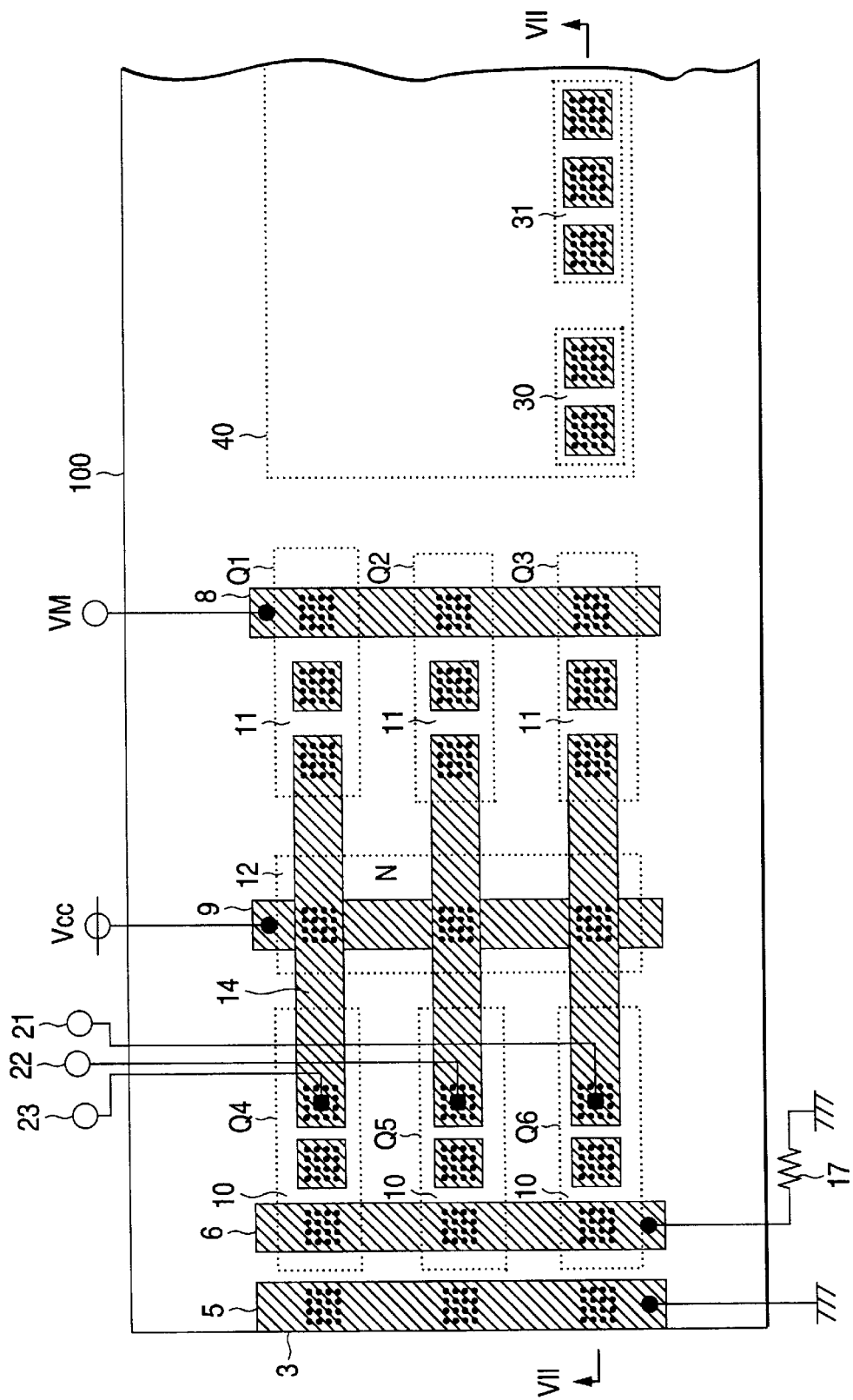
FIG. 7 is a plan view showing a semiconductor device according to a fifth embodiment of the present invention.
Figure 8:
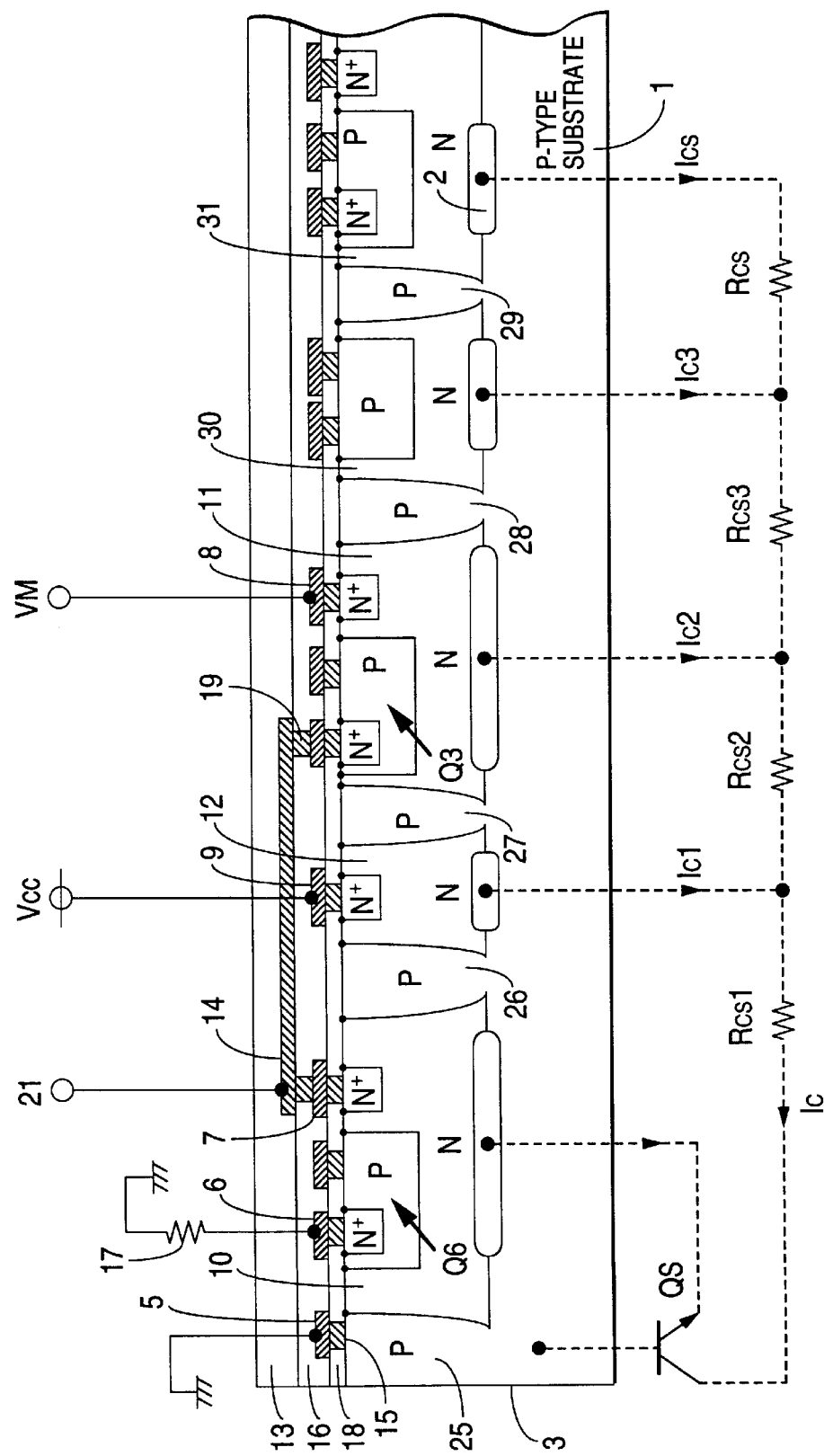
FIG. 8 is a cross-sectional view showing the semiconductor device according to the fifth embodiment of the present invention.

FIG. 7 is a plan view showing a semiconductor device for a motor drive circuit according to a fifth embodiment of the present invention. FIG. 8 is a cross-sectional view showing the semiconductor device taken along line VIII—VIII of FIG. 7.

Referring to FIGS. 7 and 8, the same elements as those shown in FIGS. 1 and 2 represent the same elements. Those same elements are omitted from the following description. Referring to FIG. 7, the collector regions, the epitaxial layer regions 11, of the power transistors Q1 to Q3 on the power supply source side are electrically connected to the power supply node VM. The emitter regions, N-type regions in the base regions, of the power transistors Q4 to Q6 on the ground side are electrically connected to the ground potential node through the resistor 17. The emitter regions, N-type regions in the base regions, of the power transistors Q1 to Q3 on the power supply source side, and the collector regions, the epitaxial layer regions 10, of the power transistors Q4 to Q6 on the ground side, are electrically connected to one another at corresponding phases and are also electrically connected to the corresponding terminals 21 to 23 of the motor drive circuit 100.

The isolation region 25, a part of an isolation region surrounding the regions 10 for the power transistors Q4 to Q6, disposed between the end 3 of the semiconductor body and the regions 10, is electrically connected to the aluminum wiring layer 5 through the through hole 15 in the insulation layer 18. The aluminum wiring layer 5 is electrically connected to the ground potential node. The N-type isolation region 12 is disposed between the motor drive circuit 100 and the small-signal circuit 40.

The N-type isolation region 12 is disposed between the power transistors Q1 to Q3 on the power supply source side and the power transistors Q4 to Q6 on the ground side. The N-type isolation region 12 is electrically connected to the aluminum wiring layer 9 through the through hole 15 in the insulation layer 18. The aluminum wiring layer 9 is electrically connected to the power supply source node Vcc.

The fourth embodiment has the same structure as the first embodiment except for the N-type isolation region 12 disposed between the power transistors Q1 to Q3 on the power supply source side and the power transistors Q4 to Q6 on the ground side. The structure will now be described.

As described above, the end 3 of the semiconductor body is electrically connected to the ground potential node and the N-type isolation region 12 is electrically connected to the power supply source node Vcc. Thus, the parasitic transistor QS is brought to a state in which a portion of the grounded isolation region 25 is the base region, the collector regions of the transistors Q4 to Q6 are emitter regions, and the collector regions of the transistors Q1 to Q3, the N-type isolation region 12, and the epitaxial layers of the resistor regions 30 and the transistor regions 31 in the small-signal circuit 40, etc., serve as a collector region.

An assumption is made that the potential of the terminal 21 is voltage V when the power transistors Q3 and Q5 of the motor drive circuit 100 have been turned on and a current is flowing from the coil LU to the coil LV of the motor 200. If the current is switched to the direction from the coil LW to the coil LV by the motor drive circuit 100, the flow of current in the coil LU is abruptly interrupted. Therefore, inductive energy stored in the coil LU is discharged through a parasitic diode between the epitaxial layer of the power transistor Q6, which is the collector region, and the semiconductor substrate 1. When a state of activation has been shifted from the transistor Q3 to the transistor Q1 and the direction in which the current flows in the coil has been switched, the potential of the collector region of the transistor Q6 is transitionally made negative from a positive voltage, as shown in FIG. 15.

At this time, the potential of the emitter region of the NPN parasitic transistor QS is lower than the potential of the base region of the NPN parasitic transistor QS electrically connected to the ground potential node. As a result, the NPN parasitic transistor QS is turned on. In the structure according to the fifth embodiment in which the P-type substrate 1 is grounded at the end 3 of the semiconductor body, the resistance Rcs of the collector series resistor components of the NPN parasitic transistor QS is raised. As a result, the parasitic collector current Ics flow in the small-signal circuit 40 is prevented. Thus, abnormal operation in the small-signal circuit 40 is prevented.

In the fifth embodiment, as the N-type isolation region 12 is disposed between the power transistors Q1 to Q3 on the power supply source side and the power transistors Q4 to Q6 on the ground side, the N-type isolation region 12 is disposed adjacent to the power transistors Q4 to Q6 on the ground side. As a result, the collector current from the N-type isolation region 12 to the collector region of the power transistors Q4 to Q6 to the NPN parasitic transistor QS is increased. Therefore, abnormal operation of the small-signal circuit 40 is effectively prevented.

Sixth Embodiment

Figure 9:
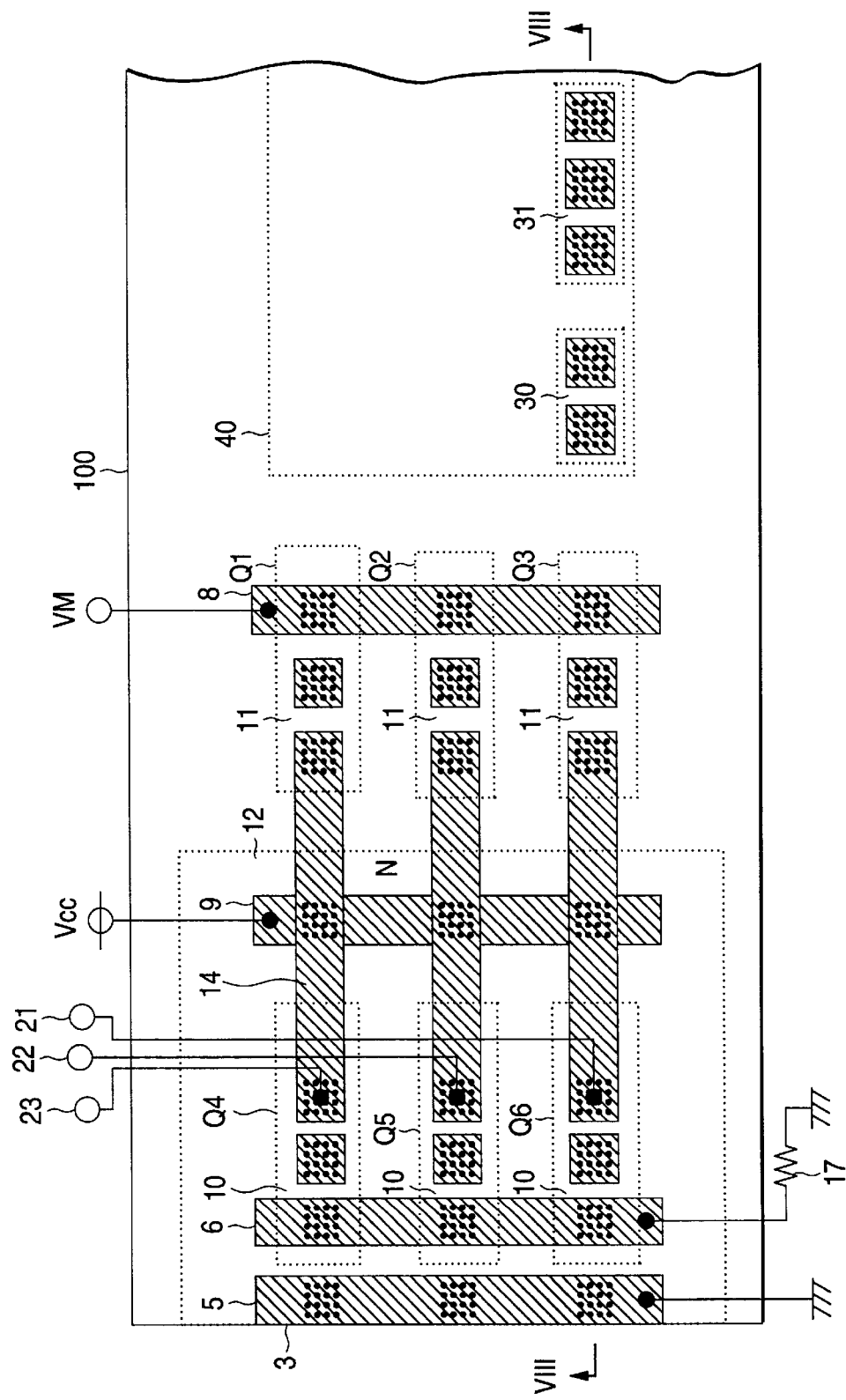
FIG. 9 is a plan view showing a semiconductor device according to a sixth embodiment of the present invention.

FIG. 9 is a plan view showing a semiconductor device for a motor drive circuit according to a sixth embodiment of the present invention. A cross-sectional view showing the semiconductor device taken along line VIII—VIII of FIG. 9 is the same as that shown in FIG. 8. Referring to FIG. 9, the same reference numerals as shown in FIG. 7 represent the same elements and so description of those same elements is omitted. The structure shown in FIG. 9 is different from that shown in FIG. 7 in that the N-type isolation region 12 surrounds the regions 10 of the power transistors Q4 to Q6 on the ground side.

Referring to FIG. 9, the collector regions, the epitaxial layer regions 11, of the power transistors Q1 to Q3 on the power supply source side are electrically connected to the power supply node VM. The emitter regions, N-type regions in the base regions, of the power transistors Q4 to Q6 on the ground side are electrically connected to the ground potential node through the resistor 17. The emitter regions, N-type regions in the base regions, of the power transistors Q1 to Q3 on the power supply source side, and the collector regions, the epitaxial layer regions 10, of the power transistors Q4 to Q6 on the ground side, are electrically connected to one another at corresponding phases and are also electrically connected to the corresponding terminals 21 to 23 of the motor drive circuit 100.

The isolation region 25, a part of an isolation region surrounding the regions 10 for the power transistors Q4 to Q6, disposed between the end 3 of the semiconductor body and the forming regions 10, is electrically connected to the aluminum wiring layer 5 through the through hole 15 in the insulation layer 18. The aluminum wiring layer 5 is electrically connected to the ground potential node. The N-type isolation region 12 is disposed between the motor drive circuit 100 and the small-signal circuit 40. The N-type isolation region 12 is electrically connected to the aluminum wiring layer 9 through the through hole 15 in the insulation layer 18. The aluminum wiring layer 9 is electrically connected to the power supply source node Vcc.

The sixth embodiment is the same as the fifth embodiment except for the N-type isolation region 12 surrounding the regions 10 of the power transistors Q4 to Q6 on the ground side in a "U" shaped pattern. As a result of the surrounding structure, a larger current can be introduced into the collector region of the power transistors Q4 to Q6 on the ground side from the N-type isolation region 12 by the NPN parasitic transistor QS. Therefore, the series resistance component Rcs between the NPN parasitic transistor QS and the small-signal circuit 40 and the collector series resistance Rcs of the NPN parasitic transistor QS are increased. The parasitic collector current Ics that flows in the small-signal circuit 40 is reduced. Thus, abnormal operation in the small-signal circuit 40 is prevented.

Moreover, as the N-type isolation region 12 has a "U" shaped pattern and is disposed between the power transistors Q1 to Q3 on the power supply source side and the power transistors Q4 to Q6 on the ground side, larger currents are introduced into the collector regions of the power transistors Q4 to Q6 on the ground side from the N-type isolation region 12 by the NPN parasitic transistor QS. Therefore, abnormal operation in the small-signal circuit 40 is more effectively prevented.

Seventh Embodiment

Figure 10:
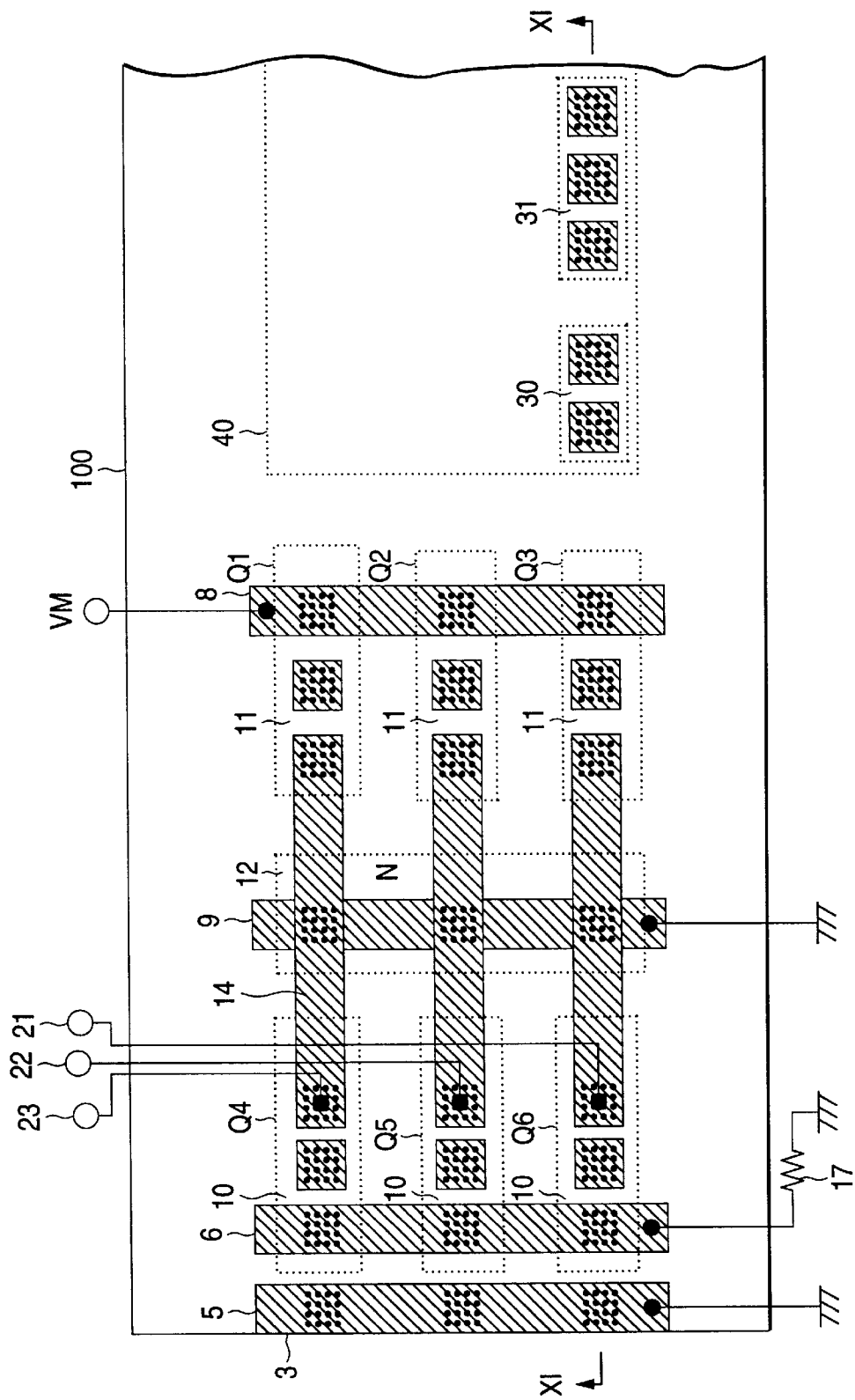
FIG. 10 is a plan view showing a semiconductor device according to a seventh embodiment of the present invention.
Figure 11:
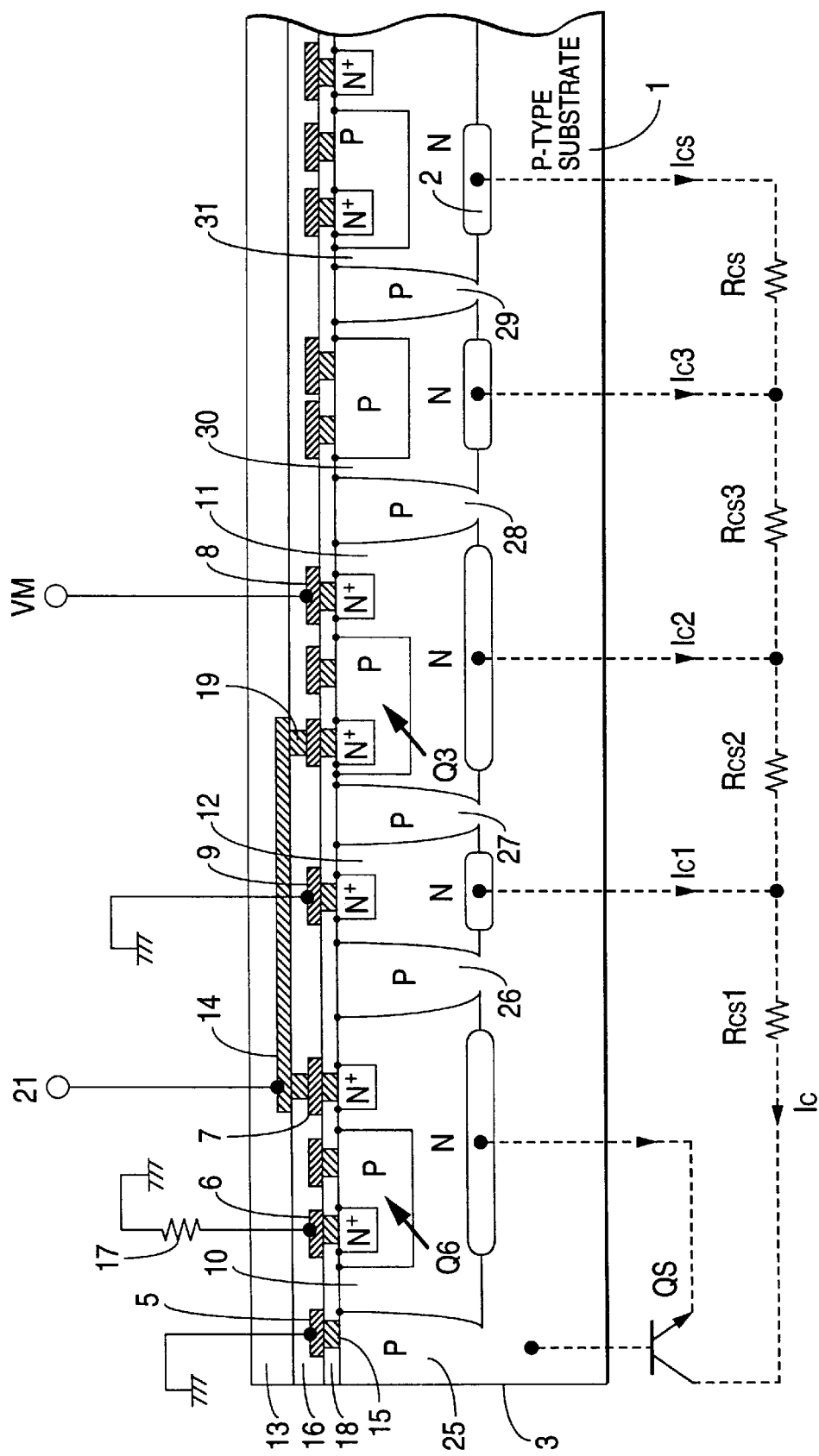
FIG. 11 is a cross-sectional view showing the semiconductor device according to the seventh embodiment of the present invention.

FIG. 10 is a plan view showing a semiconductor device for a motor drive circuit according to a seventh embodiment of the present invention. FIG. 11 is a cross-sectional view showing the semiconductor device taken along line XI—XI of FIG. 10. Referring to FIGS. 10 and 11, the same reference numerals as shown FIG. 7 and 8 represent the same elements and, therefore, description of those the elements is omitted.

Referring to FIG. 10, the collector regions, the epitaxial layer regions 11, of the power transistors Q1 to Q3 on the power supply source side are electrically connected to the power supply node VM. The emitter regions, N-type regions in the base regions, of the power transistors Q4 to Q6 on the ground side are electrically connected to the ground potential node through the resistor 17. The emitter regions, N-type regions in the base regions, of the power transistors Q1 to Q3 on the power supply source side, and the collector regions, the epitaxial layer regions 10, of the power transistors Q4 to Q6 on the ground side, are electrically connected to one another at corresponding phases and are also electrically connected to the corresponding terminals 21 to 23 of the motor drive circuit 100.

The isolation region 25, a part of an isolation region surrounding the regions 10 for the power transistors Q4 to Q6, disposed between the end 3 of the semiconductor body and the regions 10, is electrically connected to the aluminum wiring layer 5 through the through hole 15 in the insulation layer 18. The aluminum wiring layer 5 is electrically connected to the ground potential node. The N-type isolation region 12 is disposed between the motor drive circuit 100 and the small-signal circuit 40. The N-type isolation region 12 is electrically connected to the aluminum wiring layer 9 through the through hole 15 in the insulation layer 18. The aluminum wiring layer 9 is electrically connected to the ground potential node.

The structure shown in FIGS. 10 and 11 is different from that shown in FIGS. 7 and 8 in that the N-type isolation region 12 is electrically connected to the ground potential node through the through hole 15 in the insulation layer 18 and the aluminum wiring layer 9. The structure will now be described in detail.

As a result of the grounding structure, the grounded portion of the isolation region 25 is a base region of the parasitic transistor QS, the collector regions of the transistors Q4 to Q6 act as an emitter region, and the collector region of the transistors Q1 to Q3, the N-type isolation region 12, and the epitaxial layers of the resistor region 30 and the transistor region 31 in the small-signal circuit 40, etc., serve as a collector region.

An assumption is made that the potential of the terminal 21 is voltage V when the power transistors Q3 and Q5 of the motor drive circuit 100 have been turned on and a current is flowing from the coil LU to the coil LV of the motor 200. If the current is switched to the direction from the coil LW to the coil LV by the motor drive circuit 100, flow of the current in the coil LU is abruptly interrupted. Therefore, inductive energy stored in the coil LU is discharged through a parasitic diode between the epitaxial layer of the power transistor Q6, the collector region, and the semiconductor substrate 1. When a state of activation has shifted from the transistor Q3 to the transistor Q1 and the direction in which the current flows in the coil has been switched, the potential of the collector region of the transistor Q6 is transitionally made negative from a positive voltage, as shown in FIG. 15.

At this time, the potential of the emitter region of the NPN parasitic transistor QS is lower than the potential of the base region of the NPN parasitic transistor QS electrically connected to the ground potential node. As a result, the NPN parasitic transistor QS is turned on. In the structure according to the seventh embodiment in which the P-type substrate 1 is grounded at the end 3 of the semiconductor body, the resistance Rcs of the collector series resistor components of the NPN parasitic transistor QS is raised. As a result, the parasitic collector current Ics which flows in the small-signal circuit 40 is prevented. Thus, abnormal operation in the small-signal circuit 40 is prevented.

Since a large current is introduced from the collector region of the power transistor Q1 on the power supply source side, which is connected to the power supply source node VM, to the collector region of the power transistor Q6 on the ground side by the NPN parasitic transistor QS, the current from the N-type isolation region 12 to the collector region of the power transistor Q6 is lowered. Therefore, the area of the N-type isolation region 12 can be reduced as compared with the N-type isolation region 12 of the device described above by the reduced area of the N-type isolation region 12.

The third embodiment having the structure in which the aluminum wiring layer 9 is electrically connected to the ground node reduces the difference in the potential between the aluminum wiring layer 9 and the emitter region of the parasitic transistor QS, the collector region of the power transistors Q4 to Q6 on the ground side, to about 1 V. As a result, an advantage is realized in that power consumption owing to the collector current Ic2 which flows in the N-type isolation region 12 is reduced.

In the seventh embodiment, as the N-type isolation region 12 is disposed between the power transistors Q1 to Q3 on the power supply source side and the power transistors Q4 to Q6 on the ground side, the N-type isolation region 12 is disposed adjacent to the power transistors Q4 to Q6 on the ground side. As a result, the collector current from the N-type isolation region 12 to the collector regions of the power transistors Q4 to Q6 by the NPN parasitic transistor QS is increased.

Therefore, abnormal operation in the small-signal circuit 40 is more effectively prevented.

Eighth Embodiment

Figure 12:
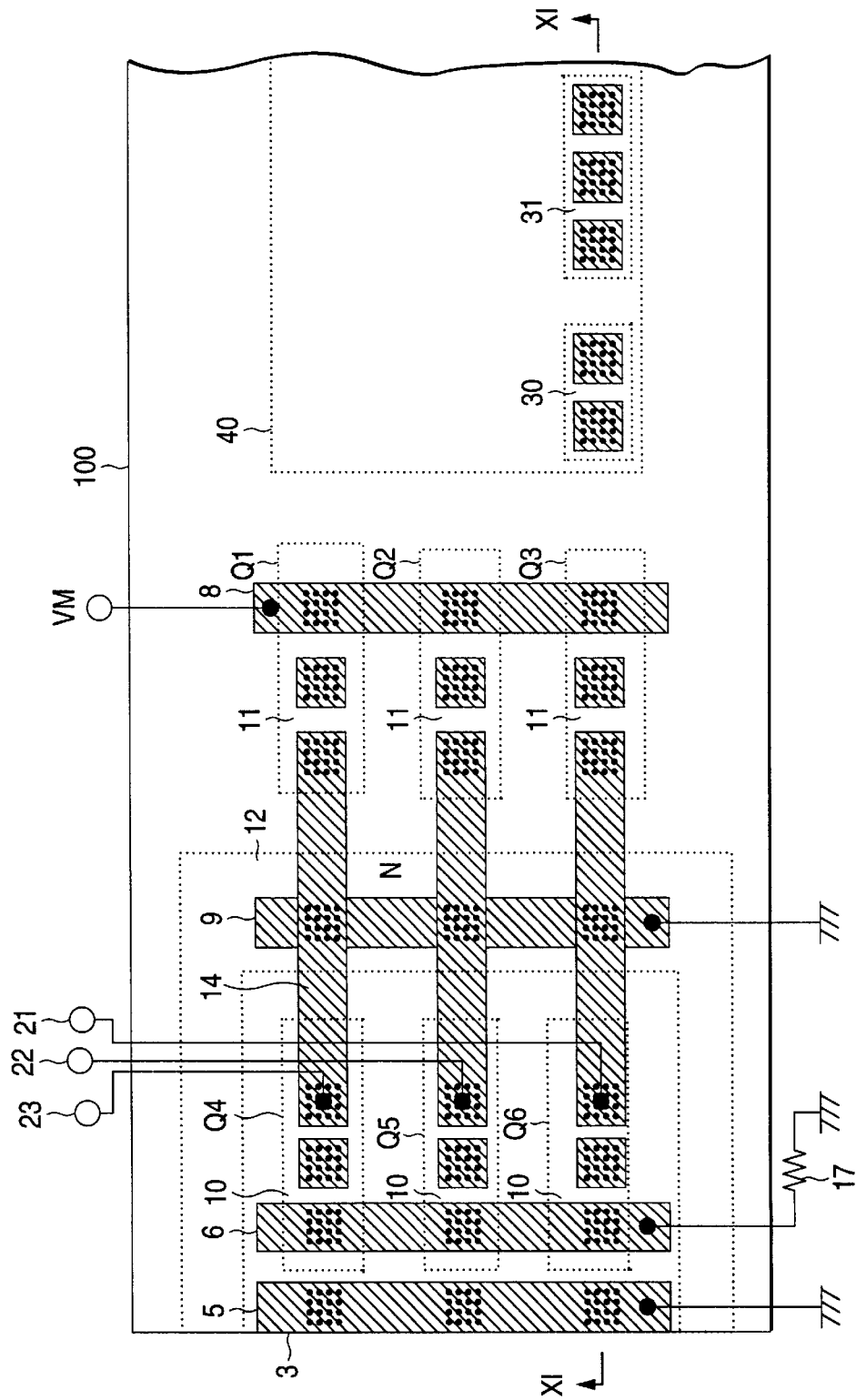
FIG. 12 is a plan view showing a semiconductor device according to an eighth embodiment of the present invention.
Figure 13:
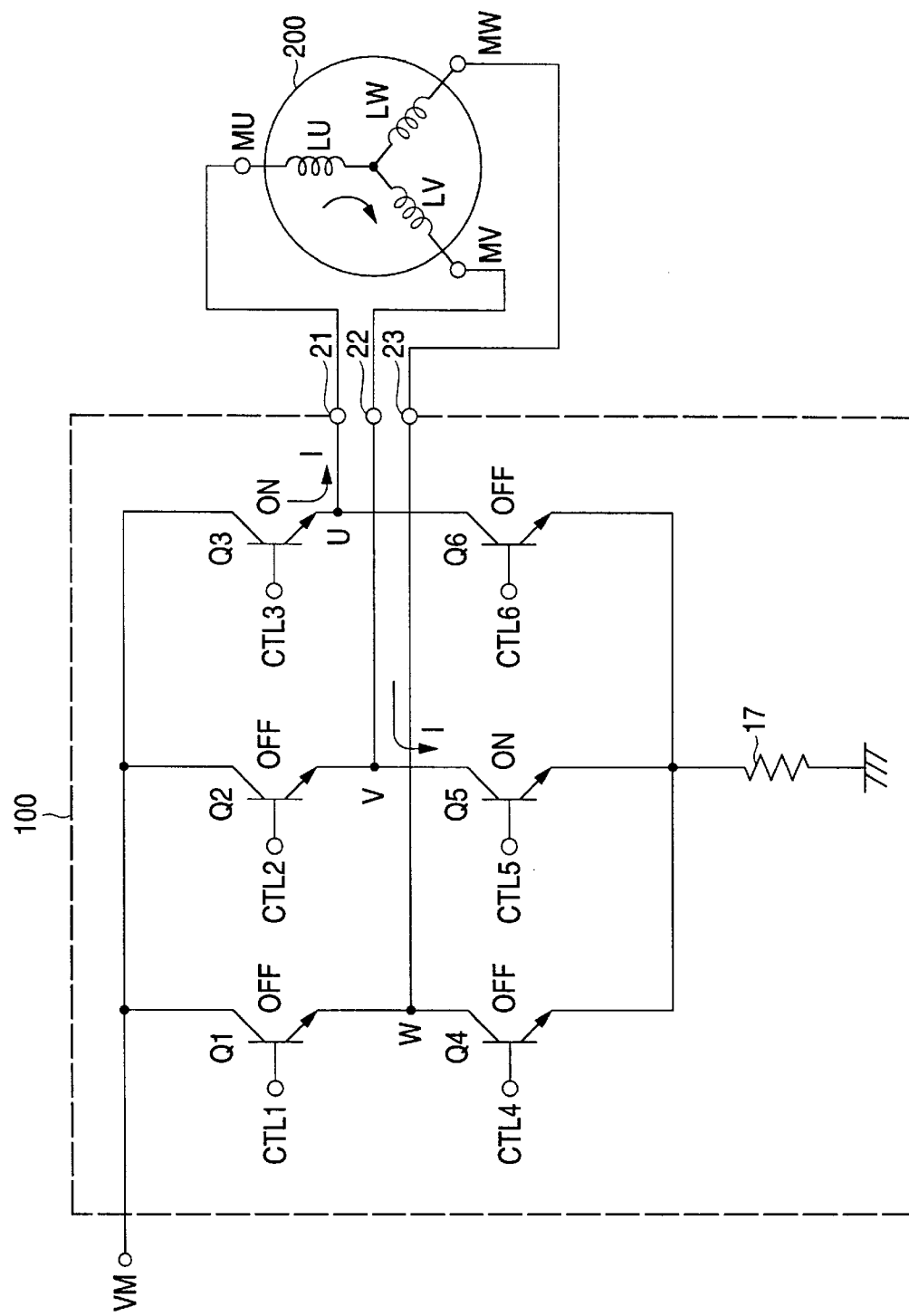
FIG. 13 is a diagram showing an example of the operation of a motor drive circuit.
Figure 14:
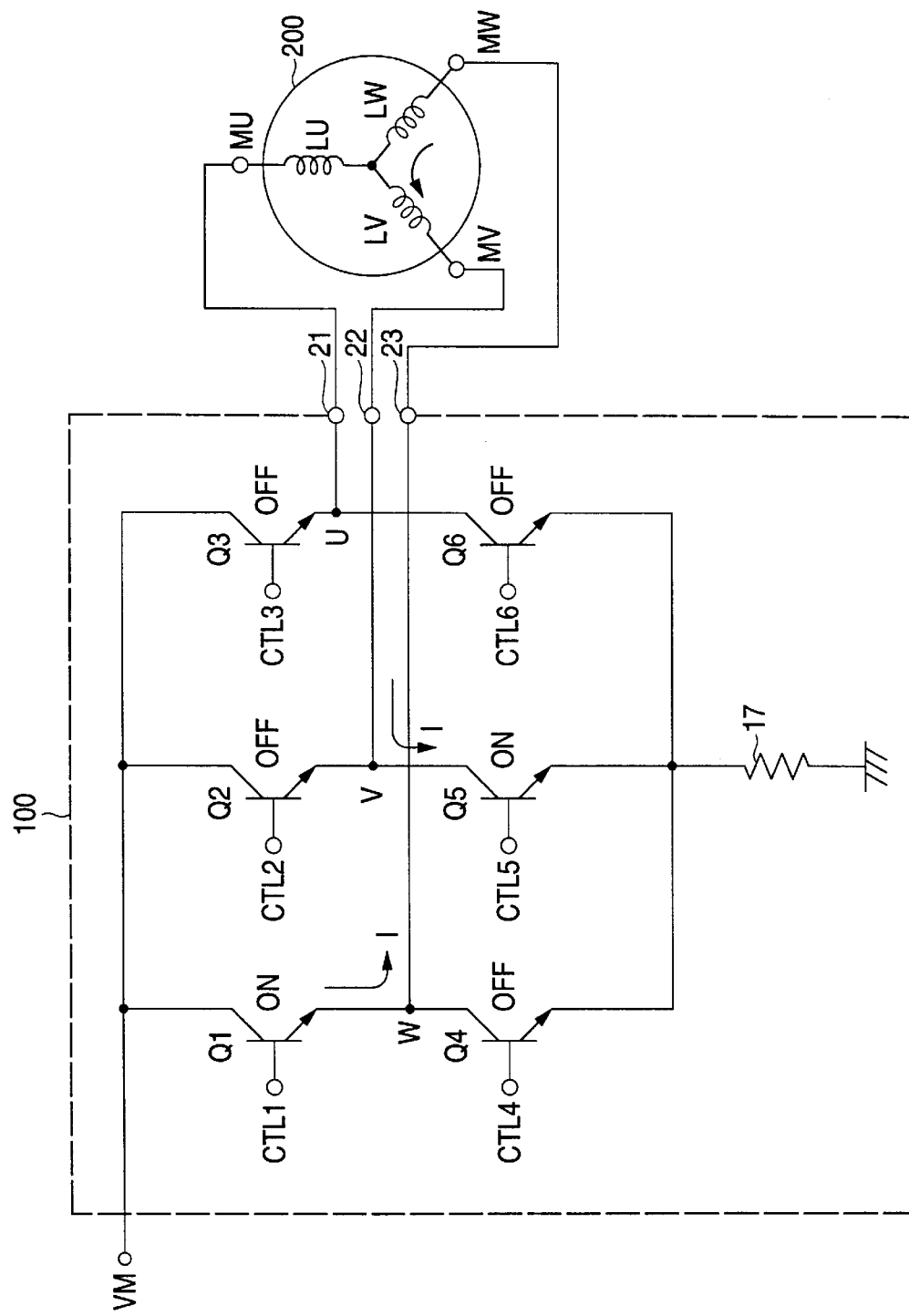
FIG. 14 is a diagram showing an example of the operation of a motor drive circuit.

FIG. 12 is a plan view showing a semiconductor device for a motor drive circuit according to an eighth embodiment of the present invention. A cross-sectional view showing the semiconductor device taken along line XI—XI of FIG. 12 is the same as FIG. 11. Referring to FIG. 12, the same reference numerals shown in FIG. 1 represent the same elements so that description of the same elements is omitted.

Referring to FIG. 12, the collector regions, the epitaxial layer regions 11, of the power transistors Q1 to Q3 on the power supply source side are electrically connected to the power supply node VM. The emitter regions, N-type regions in the base regions, of the power transistors Q4 to Q6 on the ground side are electrically connected to the ground potential node through the resistor 17. The emitter regions, N-type regions in the base regions, of the power transistors Q1 to Q3 on the power supply source side, and the collector regions, the epitaxial layer regions 10, of the power transistors Q4 to Q6 on the ground side are electrically connected to one another at corresponding phases and are also electrically connected to the corresponding terminals 21 to 23 of the motor drive circuit 100.

The isolation region 25, a part of an isolation region surrounding the regions 10 for the power transistors Q4 to Q6, disposed between the end 3 of the semiconductor body and the forming regions 10, is electrically connected to the aluminum wiring layer 5 through the through hole 15 in the insulation layer 18. The aluminum wiring layer 5 is electrically connected to the ground potential node. The N-type isolation region 12 is disposed between the motor drive circuit 100 and the small-signal circuit 40. The N-type isolation region 12 is electrically connected to the aluminum wiring layer 9 through the through hole 15 in the insulation layer 18. The aluminum wiring layer 9 is electrically connected to the ground potential node.

The eighth embodiment is the same as the seventh embodiment except that the N-type isolation region 12 surrounding the regions 10 of the power transistors Q4 to Q6 on the ground side has a "U" shaped pattern. As a result of the surrounding structure, a larger current can be introduced into the collector regions of the power transistor Q4 to Q6 on the ground side from the N-type isolation region 12 by the NPN parasitic transistor QS. Therefore, the series resistance component Rcs between the NPN parasitic transistor QS and the small-signal circuit 40 is enlarged, and the parasitic collector current Ics which flows in the small-signal circuit 40 is reduced. Thus, abnormal operation in the small-signal circuit 40 is prevented.

Since a large current is mainly introduced into the collector region of the power transistors Q4 to Q6 on the ground side from the N-type isolation region 12 by the NPN parasitic transistor QS, a similar parasitic collector current Ic1 can flow with a smaller area as compared with the structure in which the N-type isolation region 12 is disposed between the power transistors Q4 to Q6 on the ground side and the power transistors Q1 to Q3 on the power supply source side. Therefore, the area of the semiconductor body can be reduced by the reduction in the area of the N-type isolation region 12.

The eighth embodiment having the structure in which the aluminum wiring layer 9 is electrically connected to the ground node reduces the difference in the potential between the aluminum wiring layer 9 and the emitter regions of the parasitic transistor QS, the collector regions of the power transistors Q4 to Q6 on the ground side, to about 1 V. As a result, an advantage can be realized in that power consumption due to the collector current Ic1 which flows in the N-type isolation region 12 is reduced.

Moreover, as the N-type isolation region 12 has a "U" shaped pattern and is disposed between the power transistors Q1 to Q3 on the power supply source side and the power transistors Q4 to Q6 on the ground side, the structure enables larger currents to be introduced into the collector regions of the power transistors Q4 to Q6 on the ground side from the N-type isolation region 12 through the NPN parasitic transistor QS. Therefore, abnormal operation in the small-signal circuit 40 is more effectively prevented.

The semiconductor device of the present invention comprises power transistors and a small-signal circuit in a semiconductor substrate, wherein the substrate is grounded at the isolation region located at the end of the substrate, adjacent to the power transistors. Therefore, a parasitic current which flows in the small-signal circuit is prevented and abnormal operation of the small-signal circuit is prevented. Moreover, the area of the substrate can be reduced.

In another aspect of the present invention, an N-type epitaxial layer is disposed between a power transistor group and the small-signal circuit, and a power supply voltage is applied to the N-type epitaxial layer. Thus, a large current can be introduced from the N-type epitaxial layer. As a result, a parasitic current that flows in the small-signal circuit is prevented. Therefore, abnormal operation of the small-signal circuit is prevented.

In another aspect of the present invention, in the structure in which an N-type epitaxial layer is disposed between the power transistor portion and the small-signal circuit, the N-type epitaxial layer is grounded. As a result, the parasitic current that flows in the small-signal circuit is prevented. Therefore, any abnormal operation of the small-signal circuit is prevented. Moreover, power consumption attributable to a current that flows in the N-type epitaxial layer is reduced.

What is claimed is:

1. A semiconductor device for driving an inductive load comprising:

a semiconductor body having an end;

a group of power transistors for driving an inductive load and located in the semiconductor body;

a small-signal circuit for controlling the group of power transistors, located in the semiconductor body, and spaced from the group of power transistors; and an isolation region located at the end of the semiconductor body adjacent the group of power transistors, the group of power transistors being located between the isolation region and the small-signal circuit, the isolation region including a portion of the semiconductor body and an electrode electrically connected to the portion of the semiconductor body and to a ground potential node.

2. The semiconductor device according to claim 1, wherein the semiconductor body includes a P-type semiconductor substrate and an N-type semiconductor layer on the semiconductor substrate, the isolation region is a P-type region, and further comprising an N-type guard region in the semiconductor body between the group of power transistors and the signal circuit, the guard region being electrically connected to a power supply source node.

3. The semiconductor device according to claim 2, wherein the guard region surrounds the group of power transistors on three sides but not at a side adjacent to the end of the semiconductor body.

4. The semiconductor device according to claim 1, wherein the semiconductor body includes a P-type semiconductor substrate and an N-type semiconductor layer on the semiconductor substrate, the isolation region is a P-type region, and further comprising an N-type guard region in the semiconductor body between the group of power transistors and the signal circuit, the guard region being electrically connected to the ground potential node.

5. The semiconductor device according to claim 4, wherein the guard region surrounds the group of power transistors on three sides but not at a side adjacent to the end of the semiconductor body.

6. The semiconductor device according to claim 1, wherein the group of power transistors includes power transistors on a power supply source side remote from the end and power transistors on a ground side proximate the end, the semiconductor body includes a P-type semiconductor substrate and an N-type semiconductor layer on the semiconductor substrate, the isolation region includes a P-type region, and further comprising an N-type guard region in the semiconductor body between the power transistors on the power supply source side and the power transistors on the ground side, the guard region being electrically connected to a power supply source node.

7. The semiconductor device according to claim 6, wherein the guard region surrounds the power transistors on the ground side on three sides but not on a side adjacent to the end of the semiconductor body.

8. The semiconductor device according to claim 1, wherein the group of power transistors includes power transistors on a power supply source side remote from the end and power transistors on a ground side proximate the end, the semiconductor body includes a P-type semiconductor substrate and an N-type semiconductor layer on the semiconductor substrate, the isolation region includes a P-type region, and further comprising an N-type guard region in the semiconductor body between the power transistors on the power supply source side and the power transistors on the ground side, the guard region being electrically connected to the ground potential node.

9. The semiconductor device according to claim 8, wherein the guard region surrounds the power transistors on the ground side on three sides but not on a side adjacent to the end of the semiconductor body.

10. A semiconductor device for driving a motor, the device comprising:

a semiconductor body having an end and including a P-type semiconductor substrate and an N-type epitaxial layer on the semiconductor substrate, the semiconductor body having a first area and a second area along a first direction;

a group of power transistors for driving a motor and located in the first area of the semiconductor body;

a small-signal circuit for controlling the group of power transistors and located in the second area; and a P-type isolation region extending through the epitaxial layer to the semiconductor substrate and located adjacent the group of power transistors, the P-type isolation region being positioned between the first area of the semiconductor body and the end of the semiconductor body along the first direction, and including a portion of the epitaxial layer and an electrode electrically connected to the portion of the semiconductor body and to a ground potential node, the first area being disposed between the P-type isolation region and the second area.

11. The semiconductor device according to claim 10, further comprising a guard region disposed between the first area and the second area in the semiconductor body, the guard region including an N-type region, the guard region being electrically connected to a power supply source node.

12. The semiconductor device according to claim 11, wherein the guard region extends along three sides of the first area of the semiconductor body in a "U"-shaped pattern.

13. The semiconductor device according to claim 10, further comprising a guard region disposed between the first area and the second area in the semiconductor body, the guard region including an N-type region, the guard region being electrically connected to the ground potential node.

14. The semiconductor device according to claim 13, wherein the guard region extends along three sides of the first area of the semiconductor body in a "U"-shaped pattern.

15. The semiconductor device according to claim 10, wherein the group of power transistors includes power transistors on a power supply source side remote from the end and power transistors on a ground side proximate the end, the power transistors on the power source side and on the ground side being disposed along the first direction, collector regions of the power transistors on the power supply source side are electrically connected to a power supply source node, emitter regions of the power transistors on the power supply source side are connected to respective output nodes, base regions of the power transistors of the power supply source side receiving respective control signals from the small-signal circuit, collector regions of the power transistors on the ground side are electrically connected to respective output nodes, emitter regions of the power transistors on the ground side are electrically connected to the ground potential node, and base regions of the power transistors on the ground side receiving respective control signals from the small-signal circuit.

16. The semiconductor device according to claim 15, further comprising a guard region disposed between the power transistors on the power supply source side and the power transistors on the ground side, the guard region including an N-type epitaxial region surrounding the power transistors on the ground side on three sides, the guard region being electrically connected to the ground potential node.

17. The semiconductor device according to claim 10, wherein the group of power transistors includes a group of power transistors on a power supply source side remote from the end and a group of power transistors on a ground side proximate the end, the group of power transistors on the power supply source side and on the ground side being disposed along the first direction, the group of power transistors on the power supply source side includes a U-phase power transistor, a V-phase power transistor, and a W-phase power transistor disposed along a second direction orthogonal to the first direction, a collector region of the U-phase power transistor on the power supply source side is electrically connected to a power supply source node, an emitter region of the U-phase power transistor on the power supply source side is electrically connected to a U-phase terminal of the motor, and a base region of the U-phase power transistor on the power supply source side receives a control signal from the small-signal circuit, a collector region of the V-phase power transistor on the power supply source side is electrically connected to a power supply source node, an emitter region of the V-phase power transistor on the power supply source side is electrically connected to a V-phase terminal of the motor, and a base region of the V-phase power transistor on the power supply source side receives a control signal from the small-signal circuit, and a collector region of the W-phase power transistor on the power supply source side is electrically connected to a power supply source node, an emitter region of the W-phase power transistor on the power supply source side is electrically connected to a W-phase terminal of the motor, and a base region of the W-phase power transistor on the power supply source side receives a control signal from the small-signal circuit, and the group of power transistors on the ground side has a U-phase power transistor, a V-phase power transistor, and a W-phase power transistor disposed along the second direction, a collector region of the U-phase power transistor on the ground side is electrically connected to the U-phase terminal of the motor, an emitter region of the U-phase power transistor on the ground side is electrically connected to the ground potential node, and a base region of the U-phase power transistor on the ground side receives a control signal from the small-signal circuit, a collector region of the V-phase power transistor on the ground side is electrically connected to the V-phase terminal of the motor, an emitter region of the V-phase power transistor on the ground side is electrically connected to the ground potential node, and a base region of the V-phase power transistor on the ground side receives a control signal from the small-signal circuit, and a collector region of the W-phase power transistor on the ground side is electrically connected to the W-phase terminal of the motor, an emitter region of the W-phase power transistor on the ground side is electrically connected to the ground potential node, and a base region of the W-phase power transistor on the ground side receives a control signal from the small-signal circuit.

18. The semiconductor device according to claim 17, further comprising a guard region disposed between the group of power transistors on the power supply source side and the group of power transistors on the ground side, the guard region including an N-type epitaxial region surrounding power transistors on the ground side on three sides, the guard region being electrically connected to the ground potential node.

* * * * *